United States Patent
Ohkawa et al.

(10) Patent No.: US 12,424,673 B2
(45) Date of Patent: Sep. 23, 2025

(54) BATTERY CONTROL APPARATUS AND BATTERY SYSTEM

(71) Applicant: VEHICLE ENERGY JAPAN INC., Hitachinaka (JP)

(72) Inventors: Keiichiro Ohkawa, Hitachinaka (JP); Ryohhei Nakao, Tokyo (JP)

(73) Assignee: VEHICLE ENERGY JAPAN INC., Hitachinaka (JP)

( * ) Notice: Subject to any disclaimer, the term of this patent is extended or adjusted under 35 U.S.C. 154(b) by 666 days.

(21) Appl. No.: 17/789,494

(22) PCT Filed: Sep. 18, 2020

(86) PCT No.: PCT/JP2020/035632
§ 371 (c)(1),
(2) Date: Jun. 27, 2022

(87) PCT Pub. No.: WO2021/131184
PCT Pub. Date: Jan. 7, 2021

(65) Prior Publication Data
US 2023/0039183 A1 Feb. 9, 2023

(30) Foreign Application Priority Data

Dec. 26, 2019 (JP) .................. 2019-237407

(51) Int. Cl.
*G01R 31/389* (2019.01)
*G01R 31/374* (2019.01)
(Continued)

(52) U.S. Cl.
CPC ...... *H01M 10/4257* (2013.01); *G01R 31/374* (2019.01); *G01R 31/3842* (2019.01);
(Continued)

(58) Field of Classification Search
CPC .............. G01R 31/389; G01R 31/392; G01R 31/3842; H01M 10/482; H01M 10/486; H01M 2010/4271; B60L 58/12
See application file for complete search history.

(56) References Cited

U.S. PATENT DOCUMENTS

| | | | |
|---|---|---|---|
| 2010/0244886 A1 | 9/2010 | Kawahara et al. | |
| 2019/0023132 A1* | 1/2019 | Yonemoto | H01M 10/42 |
| 2019/0288344 A1* | 9/2019 | Nakao | H02J 7/00 |

FOREIGN PATENT DOCUMENTS

| | | |
|---|---|---|
| JP | 2010-256323 A | 11/2010 |
| JP | 5439126 B2 | 3/2014 |
| WO | 2017199629 A1 | 11/2017 |

OTHER PUBLICATIONS

Patent Cooperation Treaty, International Search Report, Application No. PCT/JP2020/035632, dated Nov. 17, 2020, in 4 pages.
(Continued)

*Primary Examiner* — Benyam Haile
(74) *Attorney, Agent, or Firm* — Procopio, Cory, Hargreaves & Savitch LLP

(57) ABSTRACT

A battery control apparatus for a battery system includes: a first operation unit that computes a first state of charge of a battery according to a first technique on the basis of an electric current value, a voltage value, and an internal resistance value of the battery; a second operation unit that computes a second state of charge of the battery according to a second technique different from the first technique; and a correction unit that corrects the internal resistance value of the battery. if a difference equal to or more than a specified value is detected between the first state of charge and the second state of charge, the correction unit corrects the internal resistance value of the battery with a resistance correction amount according to the difference and the electric current value.

12 Claims, 19 Drawing Sheets

(51) Int. Cl.
　　　*G01R 31/3842*　　(2019.01)
　　　*G01R 31/392*　　(2019.01)
　　　*H01M 10/42*　　(2006.01)
　　　*H01M 10/48*　　(2006.01)
　　　*H01M 50/204*　　(2021.01)
　　　*H01M 50/249*　　(2021.01)
　　　*B60L 50/60*　　(2019.01)
　　　*B60L 58/12*　　(2019.01)
　　　*B60L 58/18*　　(2019.01)

(52) U.S. Cl.
　　　CPC ......... *G01R 31/389* (2019.01); *G01R 31/392* (2019.01); *H01M 10/482* (2013.01); *H01M 10/486* (2013.01); *H01M 50/204* (2021.01); *H01M 50/249* (2021.01); *B60L 50/60* (2019.02); *B60L 58/12* (2019.02); *B60L 58/18* (2019.02); *H01M 2010/4271* (2013.01); *H01M 2220/20* (2013.01)

(56) References Cited

OTHER PUBLICATIONS

International Preliminary Report on Patentability of PCT/JP2020/035632 dated Mar. 2, 2022.

\* cited by examiner

| SOC | 0 | 10 | ... | 90 | 100 |
|---|---|---|---|---|---|
| OCV | OCV11 | OCV12 | ... | OCV19 | OCV20 |

(b) 182

| SOC / Temperature | 0 | 10 | ... | 90 | 100 |
|---|---|---|---|---|---|
| -30 | RoInit11 | RoInit12 | ... | RoInit19 | RoInit20 |
| ... | ... | ... | ... | ... | ... |
| 30 | RoInit21 | RoInit22 | ... | RoInit29 | RoInit30 |
| ... | ... | ... | ... | ... | ... |

(c) 183

| SOC / Temperature | 0 | 10 | ... | 90 | 100 |
|---|---|---|---|---|---|
| -30 | RpInit11 | RpInit12 | ... | RpInit19 | RpInit20 |
| ... | ... | ... | ... | ... | ... |
| 30 | RpInit21 | RpInit22 | ... | RpInit29 | RpInit30 |
| ... | ... | ... | ... | ... | ... |

BATTERY CONTROL APPARATUS AND BATTERY SYSTEM

CROSS-REFERENCE TO RELATED APPLICATIONS

This application is US National Stage of International Patent Application PCT/JP2020/035632, filed Sep. 18, 2020, which claims benefit of priority from Japanese Patent Application JP2019-237407, filed Dec. 26, 2019, the contents of both of which are incorporated herein by reference.

TECHNICAL FIELD

The present invention relates to a battery control apparatus and a battery system.

BACKGROUND ART

An electrically-driven vehicle system which is mounted in an electrically driven vehicle such as an electric vehicle (EV), a plug-in hybrid electric vehicle (PHEV), and a hybrid electric vehicle (HEV) has a battery as an electric power supply source and a battery control apparatus. The battery control apparatus detects a voltage, temperature, and electric current of the battery and computes a state of charge (SOC: State of Charge) and a degraded state (SOH: State of Health) of the battery, and electric power which can be input and output by the battery on the basis of the above-mentioned voltage, temperature, and electric current in order to maximize the performance of the battery.

An internal resistance of the battery increases as it degrades. Therefore, an internal resistance value of the battery is computed in real time in order to use it to appropriately compute the electric power of the battery which can be input/output; and also, a ratio of an initial internal resistance value to the internal resistance value after the degradation is calculated as the SOH, which is used as a guide to know when to change the battery.

Now, as methods for computing the internal resistance of the battery, there are: a computing method based on the internal resistance of the battery which is calculated from a ratio of a battery voltage change amount to an electric current change amount; and a computing method based on the internal resistance calculated by an equivalent circuit model of the battery.

For example, PTL 1 discloses a technique that detects an SOC difference between an SOC which is computed based on the internal resistance by the latter internal resistance operation method based on the equivalent circuit model (hereinafter referred to as SOCv) and an SOC based on an electric current integration (hereinafter referred to as SOCi), as a change in the internal resistance along with the degradation of the battery.

CITATION LIST

Patent Literature

PTL 1: U.S. Pat. No. 5,439,126

SUMMARY OF THE INVENTION

Problems to be Solved by the Invention

The above-described technique places emphasis on stability of the operation by using a relatively small, fixed value as a correction value of the internal resistance which is determined that the correction is required because the SOC difference has occurred. Accordingly, the internal resistance is corrected with the small, fixed value even when the SOH operation value recognized by the battery control apparatus is considerably different from an actual SOH (also referred to as a true SOH value) of the battery which is a control target; and, therefore, there is a problem of a slow convergence speed for the SOH operation value to converge to the true SOH value.

In order to solve the above-described problem, it is an object of the present invention to provide a battery control apparatus and a battery system which are capable of making the convergence speed of the SOH operation value faster and estimating the internal resistance value with high precision.

Means to Solve the Problems

In order to solve the above-described problem, provided according to the present invention is a battery control apparatus including: a first operation unit that computes a first state of charge of a battery according to a first technique on the basis of an electric current value, a voltage value, and an internal resistance value of the battery; a second operation unit that computes a second state of charge of the battery according to a second technique different from the first technique; and a correction unit that corrects the internal resistance value of the battery, wherein if a difference equal to or more than a specified value is detected between the first state of charge and the second state of charge, the correction unit corrects the internal resistance value of the battery with a resistance correction amount according to the difference and the electric current value.

Advantageous Effects of the Invention

Both convergence property and precision of the internal resistance operation value of the battery can be achieved according to the present invention, so that reliability of the battery system can be secured and the battery/batteries can be used efficiently.

BRIEF DESCRIPTION OF DRAWINGS

FIG. 4 is a diagram illustrating an SOC table, an internal resistance table, and a polarization resistance table;

DESCRIPTION OF EMBODIMENTS

Figure 1:
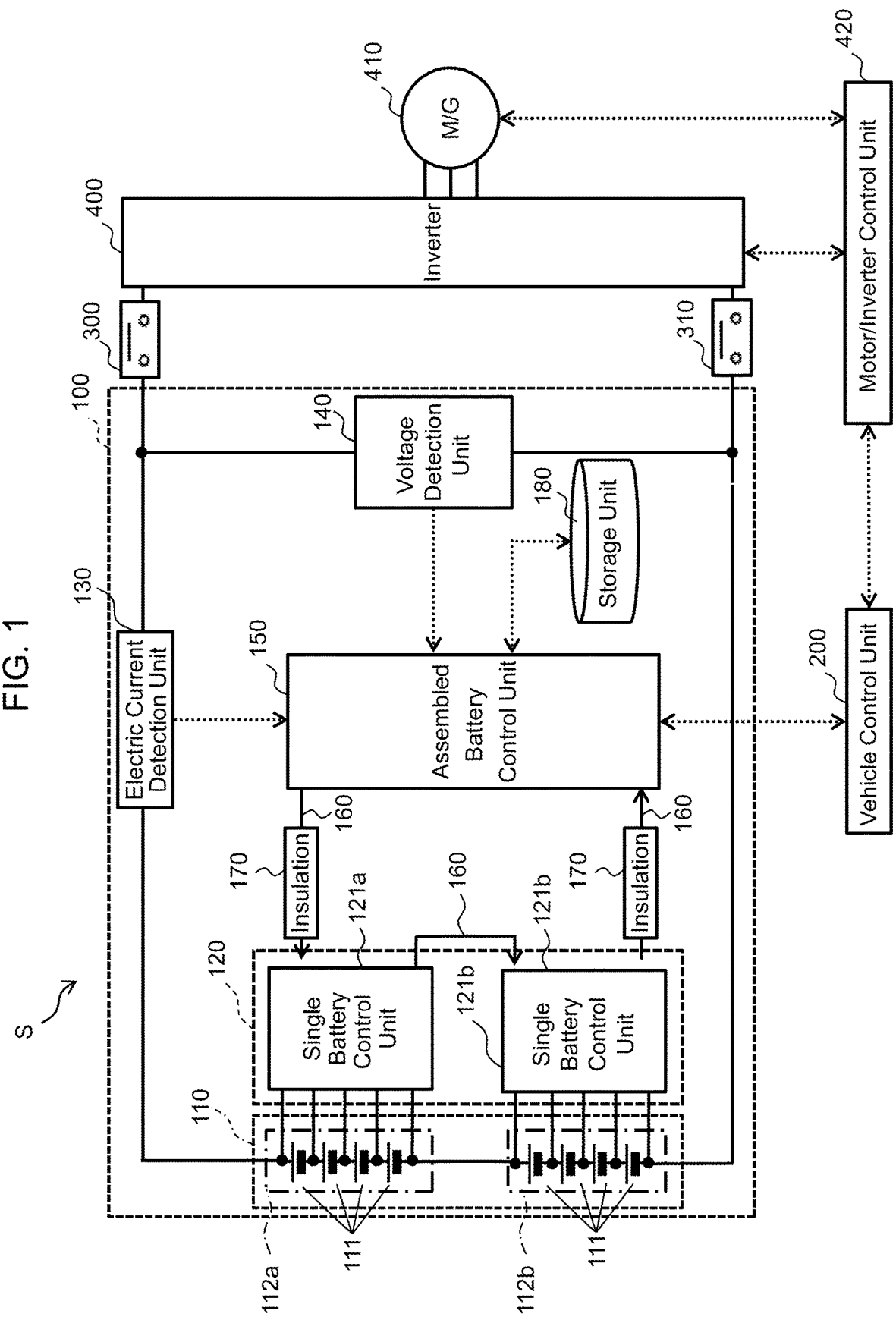
FIG. 1 is a block diagram illustrating the configuration of an electrically-powered system for a hybrid automobile according to Embodiment 1 of the present invention.

Embodiments of the present invention will be described with reference to the drawings. The drawings referenced in the description of the present invention are for illustrative purposes only. The present invention is not limited to the embodiments described below and aspects obtained by combining parts or whole of the respective embodiments and variations are also included in the disclosure of the present invention. In the description below, only configurations and processing related to the present invention will be explained and the description of other configurations and processing may sometimes be omitted. Moreover, in the description below, the same reference numeral will be given to the same or similar configurations and processing to omit duplicate explanations; and in an embodiment explained later, any duplicate explanations of the same or similar configurations and processing as those in an embodiment explained earlier may sometimes be omitted.

In the description below, for example when a plurality of elements with the same name, to which reference numerals obtained by adding branch numbers to the same number such as "xxx100a" "xxx100b" are assigned, are collectively referred to, only the same number is used to indicate the elements as, for example, "xxx100." Also, when a plurality of elements with the same name, to which signs obtained by adding branch letters are added to the same sign such as "YYYzzz1" and "YYYzzz2" are assigned, only the same number is used to indicate the elements as, for example, "YYY."

In the embodiments described below, an explanation will be provided by taking a case, as an example, where they are applied to an electric storage apparatus which configures a power source of a hybrid electric vehicle (HEV). However, without limitation to this example, the configurations of the embodiments explained below can be also applied to a condenser control circuit for an electric storage apparatus which configures a power source for an industrial vehicle like a passenger car, such as a plug-in hybrid vehicle (PHEV) and an electric vehicle (EV), or a hybrid railway vehicle.

In the embodiments described below, an explanation will be provided by taking a case, as an example, where a lithium-ion battery is applied to a condenser which configures an electrical storage unit. As other examples, a nickel-hydrogen battery, a lead battery, an electric double layer capacitor, a hybrid capacitor, and so on can be also used as the condenser.

Embodiment 1

Embodiment 1 of the present invention will be explained with reference to FIG. 1 to FIG. 14.

FIG. 1 is a block diagram illustrating the configuration of an electrically-powered system S for a hybrid vehicle according to Embodiment 1 of the present invention. In the electrically-powered system S according to this embodiment, a battery system 100 is connected via relays 300, 310 to an inverter 400 and a motor 410. A vehicle control unit 200 determines, for example, distribution of a driving force based on information such as the SOC of the battery system 100, information from the inverter 400 and the motor 410, and information of an engine (which is not illustrated in the drawing).

The configuration of the battery system 100 will be explained. The battery system 100 is configured by including: an assembled battery 110 configured from a plurality of single batteries 111; a single battery management unit 120 which monitors the status of the single batteries 111; an electric current detection unit 130 which detects an electric current flowing through the battery system 100; a voltage detection unit 140 which detects a total voltage of the assembled battery 110; an assembled battery control unit 150 which controls the assembled battery 110; and a storage unit 180 which stores information regarding battery characteristics of the single batteries 111, single battery groups 112, and the assembled battery 110.

As battery voltages and temperatures of the single batteries 111 sent from the single battery management unit 120, an electric current value flowing through the battery system 100 which is sent from the electric current detection unit 130, a total voltage value of the assembled battery 110 which is sent from the voltage detection unit 140, and additionally a diagnosis result indicating whether the single batteries 111 are overcharged or overdischarged, and an anomaly signal which is output when a communication error has occurred in the single battery management unit 120 are input, the assembled battery control unit 150 detects the status of the assembled battery 110 based on the input information. Moreover, the result of processing executed by the assembled battery control unit 150 is transmitted to the single battery management unit 120 and the vehicle control unit 200.

Figure 6:
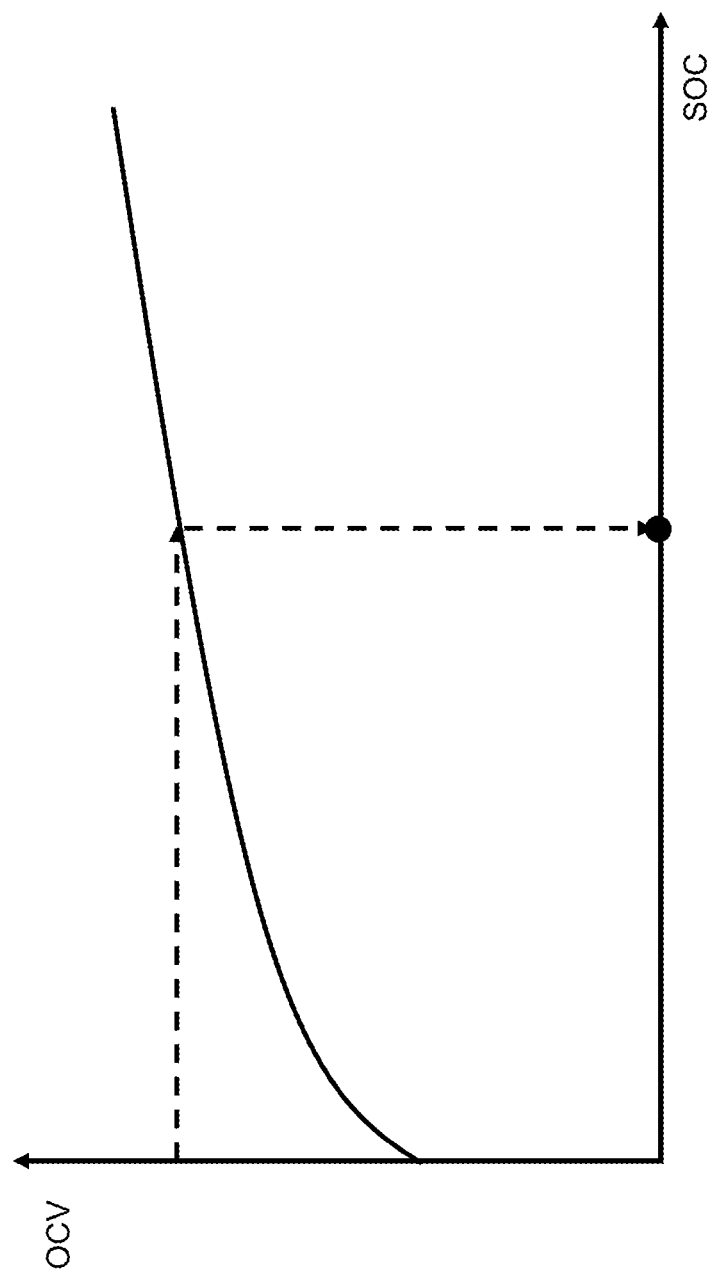
FIG. 6 is a characteristic example illustrating the relationship between SOC and OCV of a single battery.

The assembled battery 110 is configured by electrically serially connecting a plurality of the single batteries 111 (lithium-ion batteries) capable of accumulating and discharging of electric energy (electric charging/discharging of direct-current power). An explanation will be provided regarding a case where an output voltage of one single battery 111 is 3.0 to 4.2 V (average output voltage: 3.6 V) and there is a correlation between the OCV and the SOC of the single battery 111 as illustrated in FIG. 6; however, the single battery with voltage specifications other than those described above may also be used.

The single batteries 111 which configure the assembled battery 110 are formed into a specified unit number of groups when managing and controlling the status. The grouped single batteries 111 are connected electrically serially and constitute a single battery group 112. Regarding the specified unit number, for example, equal divisions of one piece, four pieces, six pieces, and so on may sometimes be used or composite divisions such as combining four pieces with six pieces may sometimes be used.

The single battery management unit 120 which monitors the status of the single batteries 111 which constitute the assembled battery 110 is configured from a plurality of single battery control units 121 and one single battery control unit 121 is assigned to the single battery group 112 which is formed as described above. The single battery control unit 121 operates by receiving the electric power from the allocated single battery group 112 and monitors the battery voltages and the temperatures of the single batteries 111 which constitute the single battery group 112. FIG. 1 illustrates the configuration where single battery control units 121a and 121b are provided corresponding to single battery groups 112a and 112b. In this embodiment, the single battery group 112 is configured, for ease of explanation, so that four single batteries 111 are connected electrically serially; and, furthermore, it is configured so that the four single batteries 111 are monitored by one single battery control unit 121.

Figure 2:
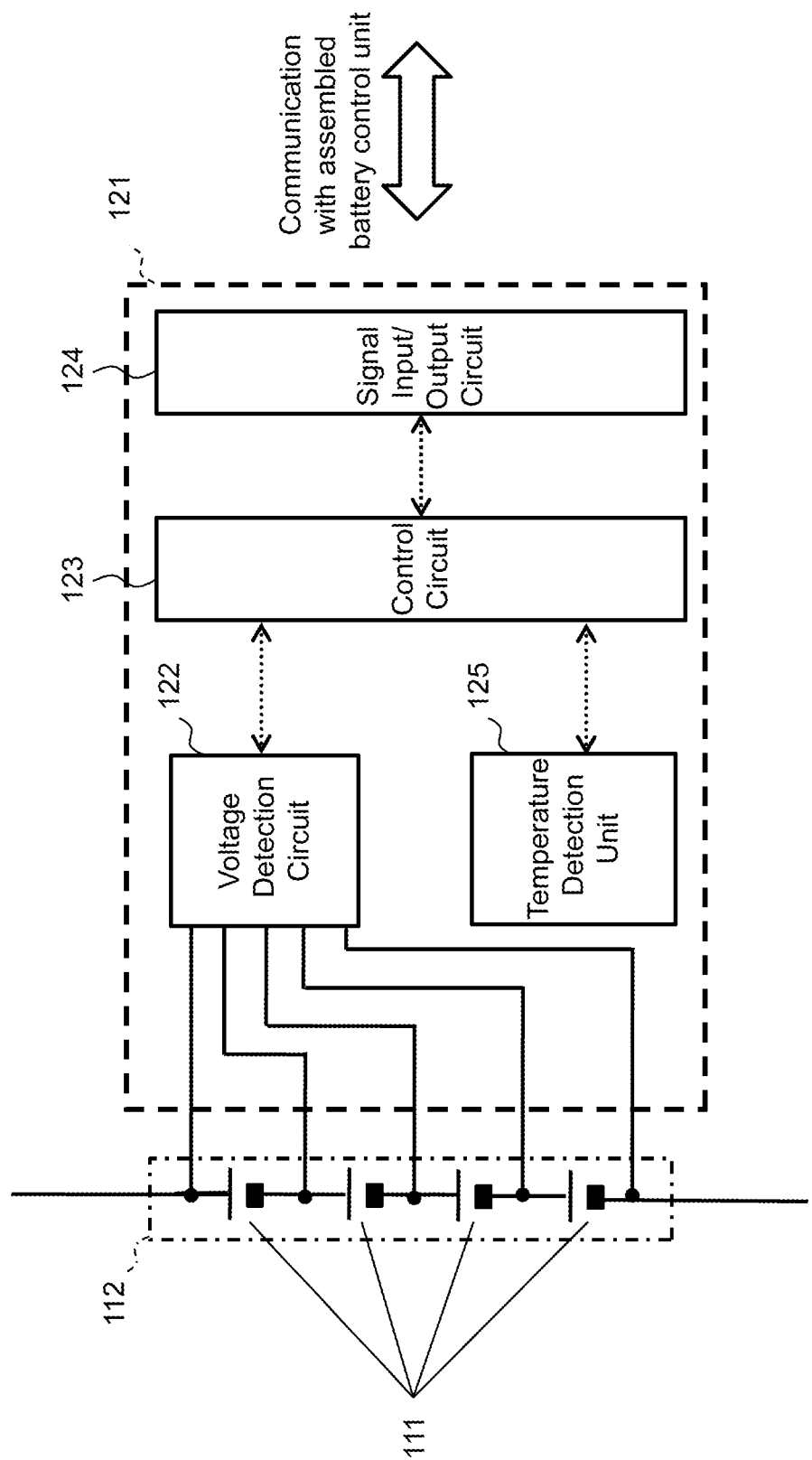
FIG. 2 is a block diagram illustrating the configuration of a single battery control unit which configures a battery system in FIG. 1.

FIG. 2 is a block diagram illustrating the configuration of the single battery control unit 121 which configures the battery system 100 in FIG. 1. The single battery control unit 121 includes a voltage detection circuit 122, a control circuit 123, a signal input/output circuit 124, and a temperature detection unit 125. The voltage detection circuit 122 measures a voltage between terminals of each single battery 111. The temperature detection unit 125 measures a temperature of the single battery group 112. The control circuit 123 receives the measurement results from the voltage detection circuit 122 and the temperature detection unit 125 and transmits them via the signal input/output circuit 124 to the assembled battery control unit 150. Incidentally, a circuit configuration which is generally mounted in the single battery control unit 121 and equalizes variations of the voltages and the SOC between the single batteries 111 which occur along with, for example, self-discharge or variations of consumed electric currents is well known, so that its description has been omitted.

The temperature detection unit 125 included in the single battery control unit 121 in FIG. 2 has a function that measures the temperature of the single battery group 112. The temperature detection unit 125 measures one temperature of the single battery group 112 as a whole and handles that temperature as a representative temperature value of the single batteries 111 which constitute the single battery group 112. The temperature measured by the temperature detection unit 125 is used for various arithmetic operations to detect the status of the single batteries 111, the single battery group 112, or the assembled battery 110. Since FIG. 2 is based on the representative temperature value as a premise, the single battery control unit 121 is provided with one temperature detection unit 125. It is possible to provide the temperature detection unit 125 at each single battery 111, measure the temperature of each single battery 111, and execute various arithmetic operations based on the temperature of each single battery 111; however, in this case, as the number of the temperature detection units 125 becomes large, the configuration of the single battery control unit 121 becomes complicated.

FIG. 2 simply illustrates the temperature detection unit 125. Practically, a temperature sensor is installed at a temperature measurement object; the installed temperature sensor outputs temperature information as a voltage; this measurement result is transmitted via the control circuit 123 to the signal input/output circuit 124; and the signal input/output circuit 124 outputs the measurement result to outside of the single battery control unit 121. The single battery control unit 121 is equipped with a function that implements this sequence of flow as the temperature detection unit 125; however, the voltage detection circuit 122 can be also used to measure the temperature information (voltage).

Referring back to FIG. 1, the assembled battery control unit 150 and the single battery management unit 120 transmit/receive signals to/from the signal communication unit 160 via an insulation element 170 like a photocoupler. The insulation element 170 is provided because the assembled battery control unit 150 and the single battery management unit 120 have different operating power sources. Specifically speaking, the single battery management unit 120 operates by receiving the electric power from the assembled battery 110, while the assembled battery control unit 150 uses a battery for an in-vehicle auxiliary machine (for example, a 12-V battery) as a power source. The insulation element 170 may be mounted in a circuit board which configures the single battery management unit 120, or may be mounted in a circuit board which configures the assembled battery control unit 150. Incidentally, it is even possible to omit the insulation element 170, depending on the system configuration.

The signal communication unit 160 between the assembled battery control unit 150 and the single battery control units 121a and 121b according to this embodiment will be explained. The single battery control units 121a and 121b are connected serially in descending order of electric potentials of the single battery groups 112a and 112b which they respectively monitor. A signal transmitted by the assembled battery control unit 150 is input by the signal communication unit 160 via the insulation element 170 into the single battery control unit 121a. The output of the single battery control unit 121a and the input of the single battery control unit 121b are similarly connected by the signal communication unit 160 to transmit the signal.

Incidentally, in this embodiment, the insulation element 170 is not interposed between the single battery control units 121a and 121b, but the insulation element 170 may be interposed between them. Then, the output from the single battery control unit 121b is input by the signal communication unit 160 via the insulation element 170 into the assembled battery control unit 150. Accordingly, the assembled battery control unit 150 and the single battery control units 121a and 121b are connected in a loop shape by the signal communication unit 160. This loop connection may be sometimes called, for example, a daisy chain connection.

Figure 3:
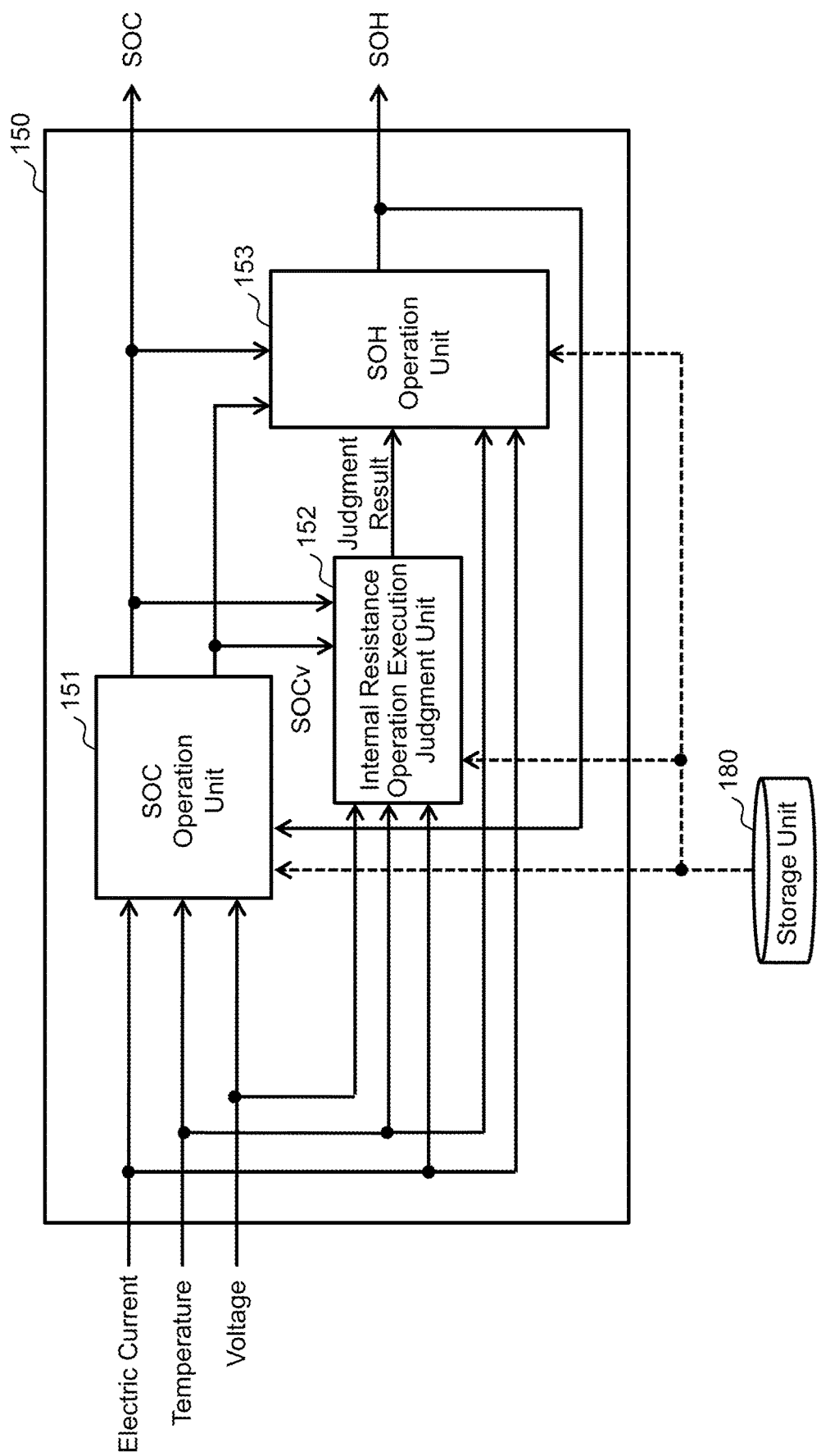
FIG. 3 is a block diagram illustrating the configuration of an assembled battery control unit which configures the battery system in FIG. 1.

The configuration of the assembled battery control unit 150 will be explained with reference to FIG. 3. FIG. 3 is a block diagram illustrating the configuration of the assembled battery control unit 150 which configures the battery system 100 in FIG. 1. In this embodiment, an explanation is omitted for the sake of simplicity regarding the processing content based on a diagnosis result regarding the single batteries 111 or an anomaly signal which is output when, for example, a communication error has occurred in the single battery management unit 120; and the configuration regarding the SOC and SOH operations will be explained.

The assembled battery control unit 150 is configured by including an SOC operation unit 151, an internal resistance operation execution judgment unit 152, and an SOH operation unit 153. The SOC operation unit 151: receives inputs of an average voltage of the respective single batteries 111 which constitute the assembled battery 110, the electric current which flows through the assembled battery 110, the temperature of the assembled battery 110, and the SOH which is output from the SOH operation unit 153; and outputs the SOC and the SOCv. The operation processing content of the SOC and the SOCv will be described later.

The internal resistance operation execution judgment unit 152: receives inputs of the average voltage of the respective single batteries 111 which constitute the assembled battery 110, the electric current flowing through the assembled battery 110, the temperature of the assembled battery 110, and the SOC and the SOCv which are output from the SOC operation unit 151; judges whether the SOH operation can be executed or not; and outputs the judgment result. The SOH operation unit 153: receives inputs of the SOC and the SOCv which are output from the SOC operation unit 151, the temperature, the electric current, and the judgment result which is output from the internal resistance operation execution judgment unit 152; and computes and outputs the SOH. The computed SOC and SOH are transmitted to the vehicle control unit 200.

The storage unit 180 stores information such as internal resistance characteristics, capacity when fully charged, polarization resistance characteristics, degradation characteristics, individual difference information, a correspondence relationship between the SOC and the OCV of the assembled battery 110, the single batteries 111, and the single battery group 112. Incidentally this embodiment is configured so that the storage unit 180 is installed outside of the assembled battery control unit 150 or the single battery management unit 120; however, the assembled battery control unit 150 or the single battery management unit 120 may be provided with a storage unit.

FIG. 4 is a diagram illustrating an SOC table 181, an internal resistance table 182, and a polarization resistance table 183. The SOC table 181, the internal resistance table 182, and the polarization resistance table 183 are stored in the storage unit 180.

Referring to FIG. 4(*a*), the SOC table 181 is a data table which describes a correspondence relationship between the SOC and the OCV (Open Circuit Voltage) of the single battery 111 in accordance with the temperature.

Moreover, referring to FIG. 4(*b*), the internal resistance table 182 is a data table which describes a correspondence relationship between the temperature and the SOC of the single battery 111 and an initial resistance value RoInit of Ro. The initial resistance value RoInit of Ro is a resistance value of Ro when the battery is new and the single battery 111 is expressed as an equivalent circuit as in FIG. 7.

Furthermore, referring to FIG. 4(*c*), the polarization resistance table 183 is a data table which describes a correspondence relationship between the temperature and the SOC of the single battery 111 and an initial resistance value RpInit of Rp. The initial resistance value RpInit of Rp is a resistance value of Rp when the battery is new and the single battery 111 is expressed as an equivalent circuit as in FIG. 7.

Incidentally, the data tables are used to explain this embodiment; however, each correspondence relationship may be expressed as, for example, a mathematical expression and is not limited to the form of the data tables as illustrated in the drawing.

Figure 5:
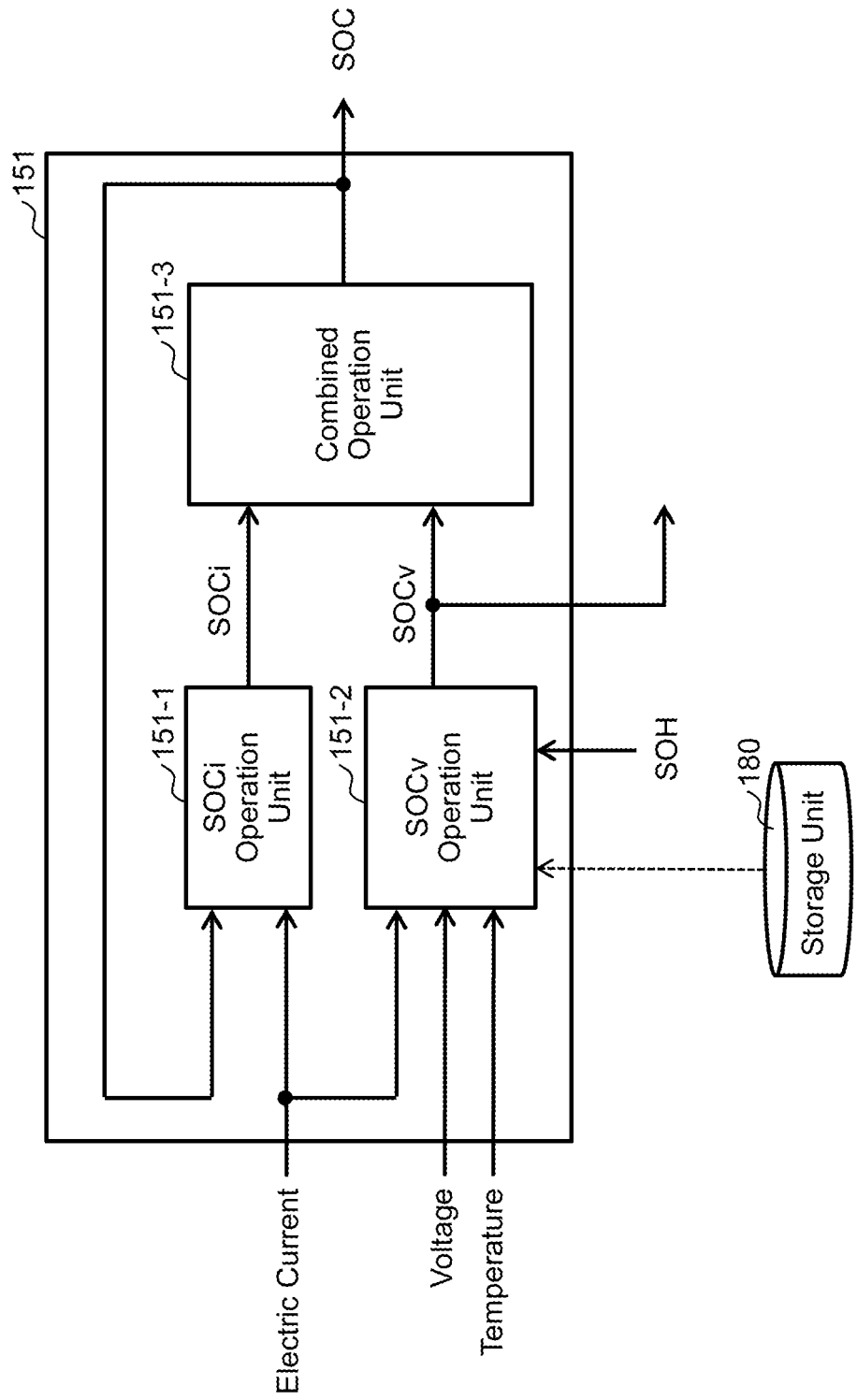
FIG. 5 is a block diagram illustrating the configuration of an SOC operation unit that configures the assembled battery control unit according to Embodiment 1.

The SOC operation units 151 which constitute the assembled battery control unit 150 will be explained with reference to FIG. 5 and FIG. 6. FIG. 5 is a block diagram illustrating the configuration of the SOC operation units 151 which constitute the assembled battery control unit 150 according to Embodiment 1. FIG. 6 is a characteristic example illustrating the relationship between the SOC and the OCV of the single battery 111.

Referring to FIG. 5, the SOC operation unit 151 is configured by including an SOCi operation unit 151-1, an SOCv operation unit 151-2, and a combined operation unit 151-3.

The SOCi operation unit 151-1: receives inputs of the electric current and the previous value of the SOC operation result (the operation result of one cycle before) output from the combined operation unit 151-3; and computes and outputs the SOC based on an integrated value of the electric current (hereinafter referred to as SOCi). The SOCv operation unit 151-2: computes the OCV based on the battery voltage, the electric current, and the temperature; and computes the SOC based on the correspondence relationship between the OCV and the SOC as illustrated in FIG. 4(*a*) and FIG. 6 (hereinafter referred to as SOCv). The combined operation unit 151-3 receives inputs of the SOCi and the SOCv and obtains and outputs a weighted average of the SOCi and the SOCv.

Next, the SOCi operation unit 151-1 will be explained. The SOCi is calculated as indicated in Expression (1) below by adding a change amount of the SOC, which is caused by flowing of the electric current, to the previous value (the operation result of one cycle before) of the result output by the combined operation unit 151-3.

[Math. 1]

$$\left.\begin{array}{l}SOC_i = SOC_{old} + \Delta SOC \\ \Delta SOC = 100 \times I \times ts/Q\max \end{array}\right\} \quad (1)$$

In the above expression, SOC_old represents the previous value (the operation result of one cycle before) of the SOC obtained by Expression (4) explained later, I represents the electric current, Qmax represents a fully-charged capacity of the single battery 111, and is represents a control cycle (a sampling cycle of, for example, the electric current and the voltage).

Figure 7:
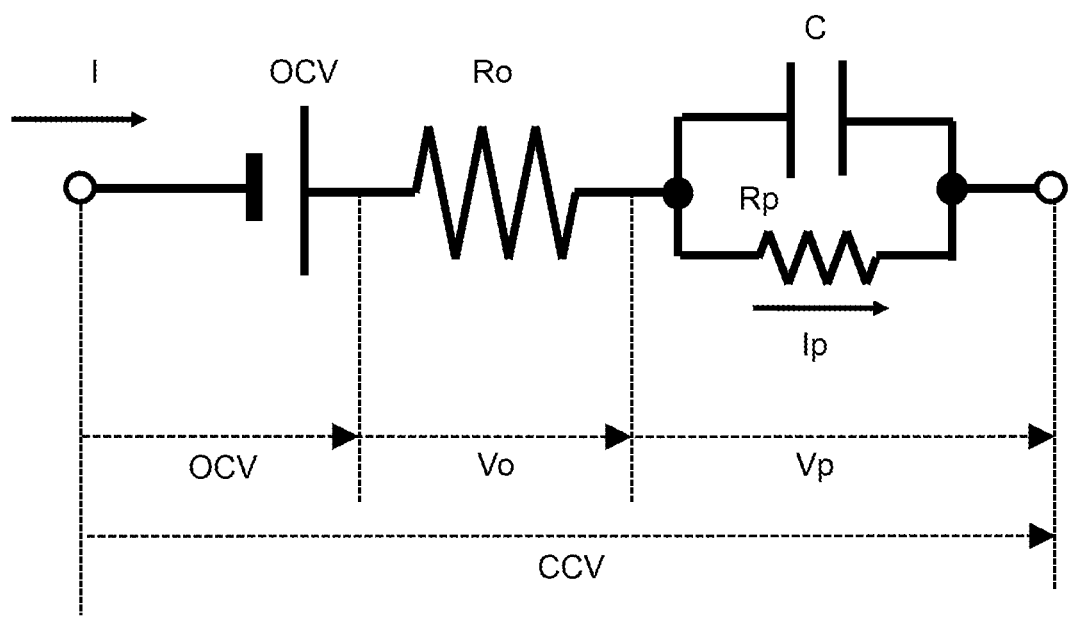
FIG. 7 is a diagram illustrating an example of an equivalent circuit model of the single battery.

The SOCv operation unit 151-2 will be explained with reference to FIG. 7 and FIG. 8. FIG. 7 is an equivalent circuit diagram of the single battery 111 and illustrates voltage behaviors when a charging electric current flows into the single battery 111 in FIG. 8. The single battery 111 has a circuit configuration designed so that a DC power source which simulates the OCV representing the open circuit voltage of the battery, Ro which represents an electric resistance of, for example, electrodes or an electrolyte, and a parallel circuit of Rp and C which simulate resistance components (polarization components) associated with an electrochemical reaction of the battery are connected serially.

Figure 8:
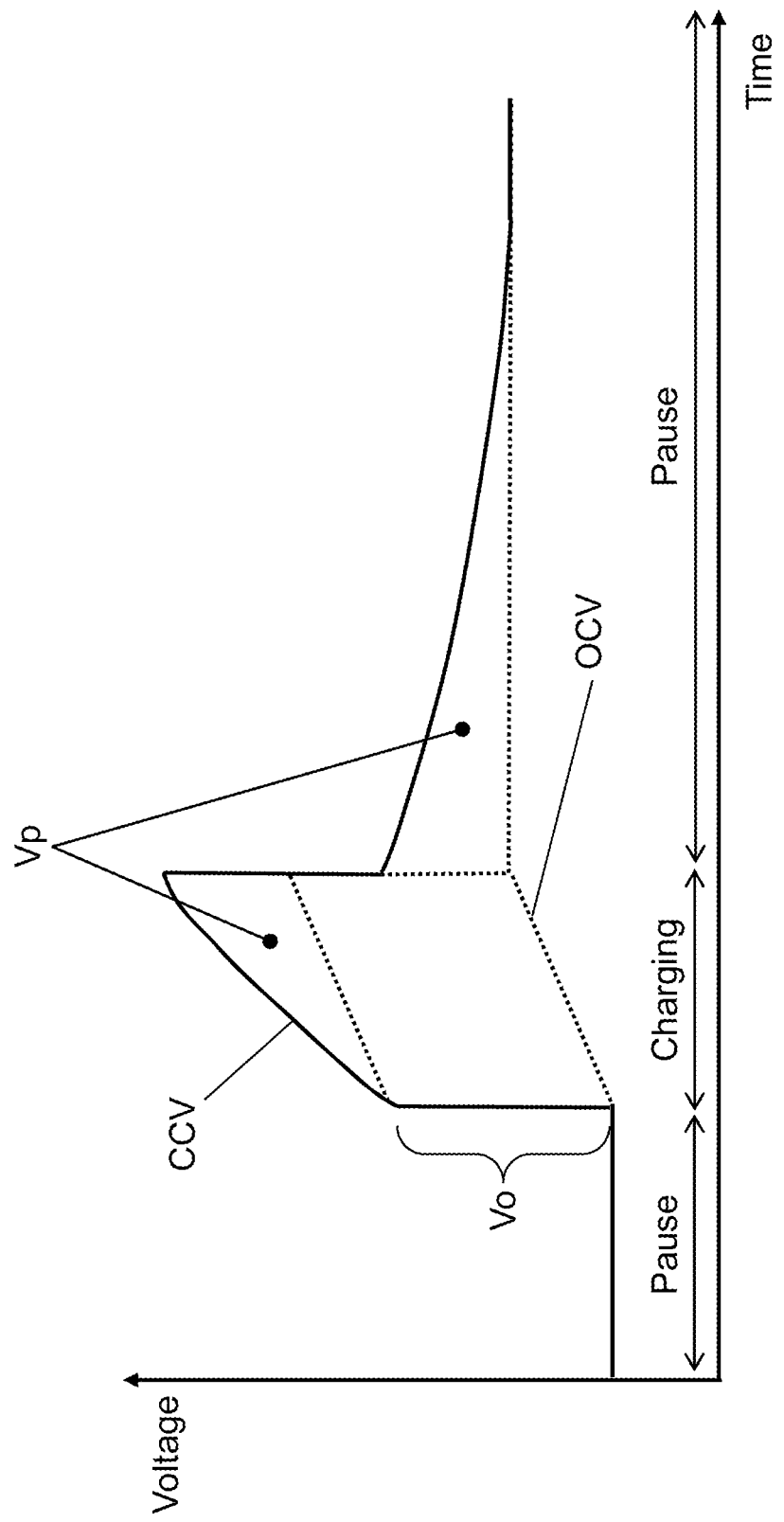
FIG. 8 is a diagram for explaining voltage behaviors of the single battery.

When the charging electric current flows as illustrated in FIG. 8, a voltage rise caused by Ro occurs relative to the OCV and then a voltage rise caused by Rp (polarization voltage) gradually occurs. When Vo represents the voltage rise caused by Ro and Vp represents the polarization voltage, the OCV can be expressed with Expression (2) below by using the equivalent circuit illustrated in FIG. 7.

[Math. 2]

$$\left.\begin{aligned} OCV &= CCV - (Vo + Vp) \\ Vo &= I \times Ro \\ Vp &= I_p \times R \\ SOCv &= Map(OCV) \end{aligned}\right\} \quad (2)$$

Ro and Rp included in the aforementioned Expression (2) are the results obtained by multiplying the respective initial resistance values RoInit, RpInit of the single batteries 111 by SOH_old which is an increase rate (%) of the internal resistance as indicated by Expression (3) below. SOH_old in Expression (3) below is the previous value (the operation result of one cycle before) obtained by Expression (6) explained later.

[Math. 3]

$$\left.\begin{aligned} Ro &= RoInit \times SOH\_old / 100 \\ Rp &= RpInit \times SOH\_old / 100 \end{aligned}\right\} \quad (3)$$

RoInit and RpInit in the aforementioned Expression (3) are the results calculated with reference to the internal resistance table 182 and the polarization resistance table 183 which are stored in the storage unit 180 in advance, and on the basis of the SOC and the temperature at present. The SOCv operation unit 151-2 computes the OCV from the first expression to the third expression of the aforementioned Expression (2) and computes the SOC corresponding the OCV, as SOCv, as indicated by the fourth expression and as illustrated in FIG. 4(*a*) and FIG. 6.

The combined operation unit 151-3 will be explained. The combined operation unit 151-3 computes the SOC according to Expression (4) indicated below by inputting the SOCi computed by the SOCi operation unit 151-1, the SOCv computed by the SOCv operation unit 151-2, the electric current, and the temperature.

[Math. 4]

$$SOC = w \times SOCv + (1-w) \times SOCi \quad (4)$$

In the above expression, w represents a weight coefficient and is calculated according to, for example, Expression (5) indicated below.

[Math. 5]

$$w = \frac{1}{1 + |I| \times Ro} \quad (5)$$

According to Expressions (4) and (5), when the electric current is large, w becomes small and a degree of partiality to SOCi thereby becomes high; and contrarily, when the electric current is small, w becomes large and a degree of partiality to SOCv thereby becomes high. In this embodiment, the weight coefficient as used in Expression (5) is provided in order to avoid any influence of an SOCv error as caused by a resistance error when the electric current is applied; however, there is no limitation to this example.

Figure 9:
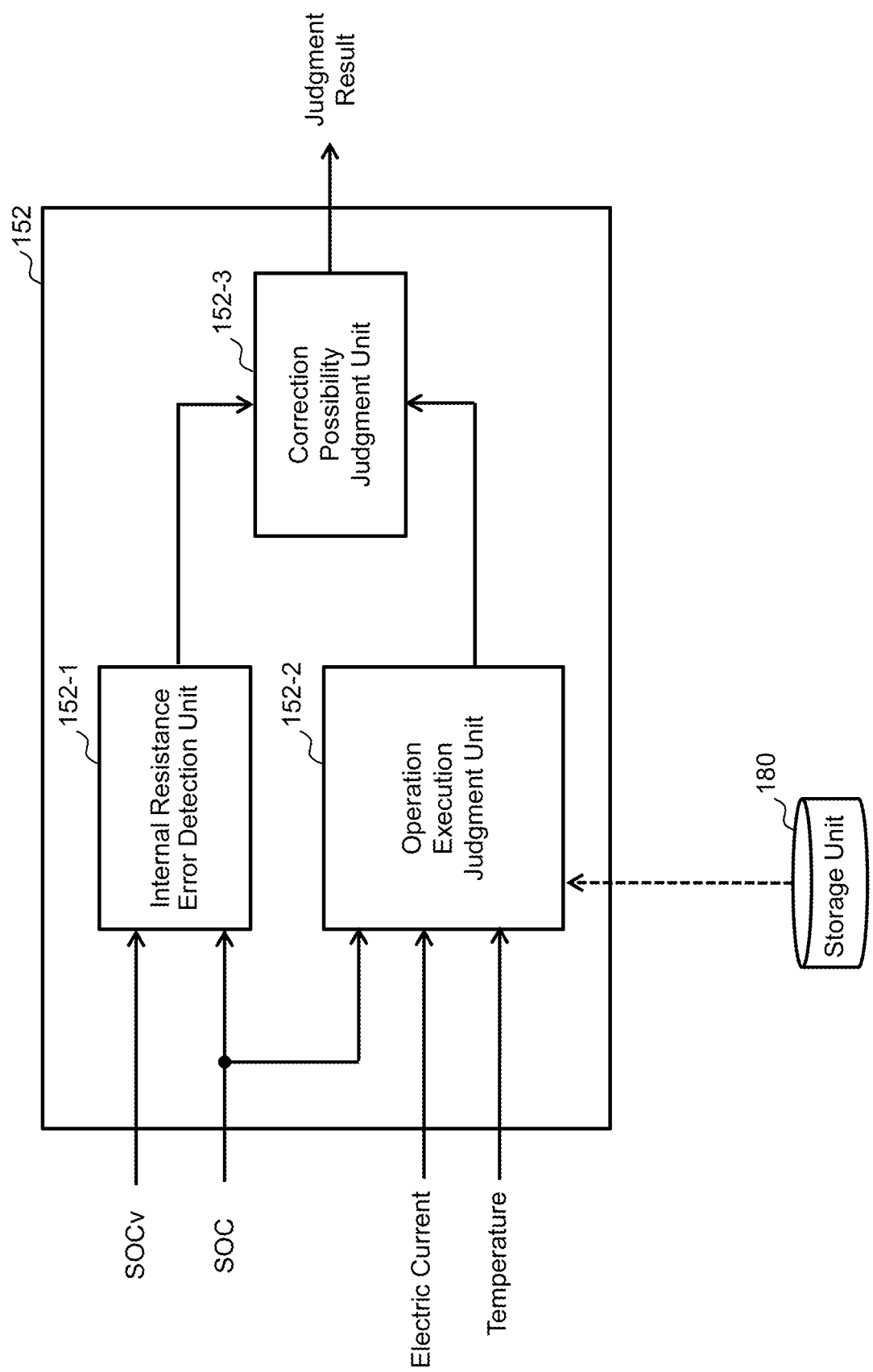
FIG. 9 is a block diagram illustrating the configuration of an internal resistance operation execution judgment unit according to Embodiment 1.

Next, the internal resistance operation execution judgment unit 152 will be explained with reference to FIG. 9. FIG. 9 is a block diagram illustrating the configuration of the internal resistance operation execution judgment unit 152 according to Embodiment 1.

Firstly, the configuration of the internal resistance operation execution judgment unit 152 will be explained with reference to FIG. 9. The internal resistance operation execution judgment unit 152 is configured by including: an internal resistance error detection unit 152-1 that judges whether or not a resistance value which is used to compute the SOCv by receiving inputs of the SOC and the SOCv, which are input from the SOC operation unit 151, has an error equal to or more than a specified value; an operation execution judgment unit 152-2 that judges whether or not the SOC, the electric current, and the voltage are within a specified range; and a correction possibility judgment unit 152-3 that judges whether or not it is possible to execute processing for correcting the internal resistance on the basis of the respective judgment results of the internal resistance error detection unit 152-1 and the operation execution judgment unit 152-2.

When an absolute value of the difference between the SOC and the SOCv which are output by the SOC operation unit 151 (an error of the SOCv) is equal to or larger than a specified value, the internal resistance error detection unit 152-1: judges that there is a discrepancy between an internal resistance value used to compute the SOCv and an internal resistance value of the battery which is a control target; and outputs the judgment result.

Next, the operation execution judgment unit 152-2 receives inputs of the SOC, the electric current, and the temperature and judges whether or not to execute an operation to correct the internal resistance value. Specifically, the operation execution judgment unit 152-2 checks whether the SOC computed by the SOC operation unit 151, the electric current, and the temperature are within a specified range or not; and if the condition requiring that all of them are within the specified range is satisfied, the operation execution judgment unit 152-2 judges that the operation can be executed, and outputs the judgment result. The specified range of the SOC, the electric current, and the temperature is decided in consideration of influences of characteristics of the battery, errors of the SOC, the electric current, and errors of a temperature sensor and is stored in the storage unit 180.

The correction possibility judgment unit 152-3 judges whether to execute the internal resistance correction operation or not on the basis of the judgment results of the internal resistance error detection unit 152-1 and the operation execution judgment unit 152-2. In this embodiment, when the correction possibility judgment unit 152-3 detects a resistance error and the SOC, the temperature, and the electric current are within the specified range, the correction possibility judgment unit 152-3 executes the internal resistance correction operation; and otherwise, the correction possibility judgment unit 152-3 does not execute the internal resistance correction operation.

Figure 10:
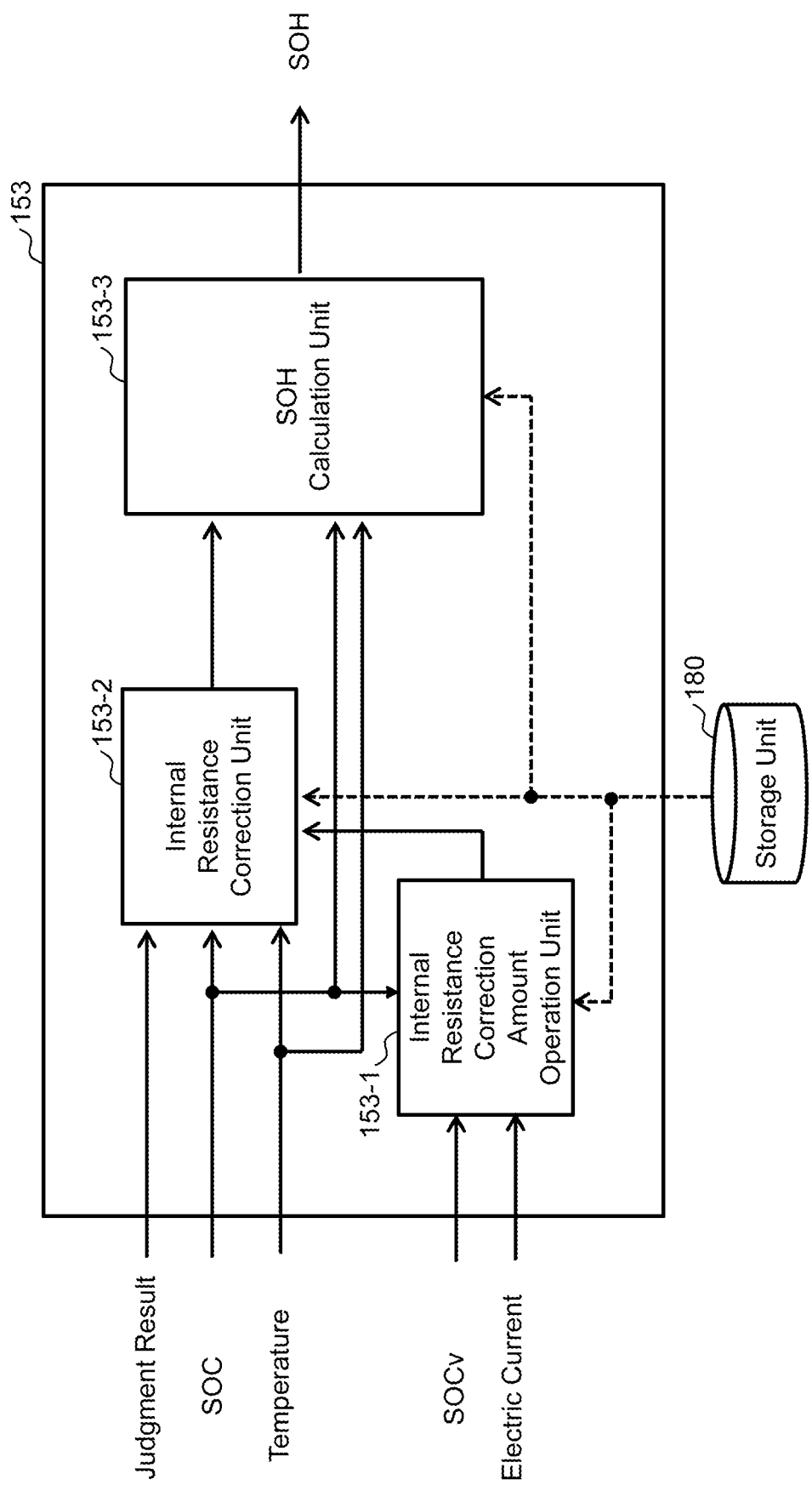
FIG. 10 is a block diagram illustrating the configuration of an SOH operation unit according to Embodiment 1.

Next, the configuration of the SOH operation unit 153 will be explained with reference to FIG. 10. FIG. 10 is a block diagram illustrating the configuration of the SOH operation unit according to Embodiment 1. The SOH operation unit 153 is configured by including an internal resistance correction amount operation unit 153-1, an internal resistance correction unit 153-2, and an SOH calculation unit 153-3.

Figure 11:
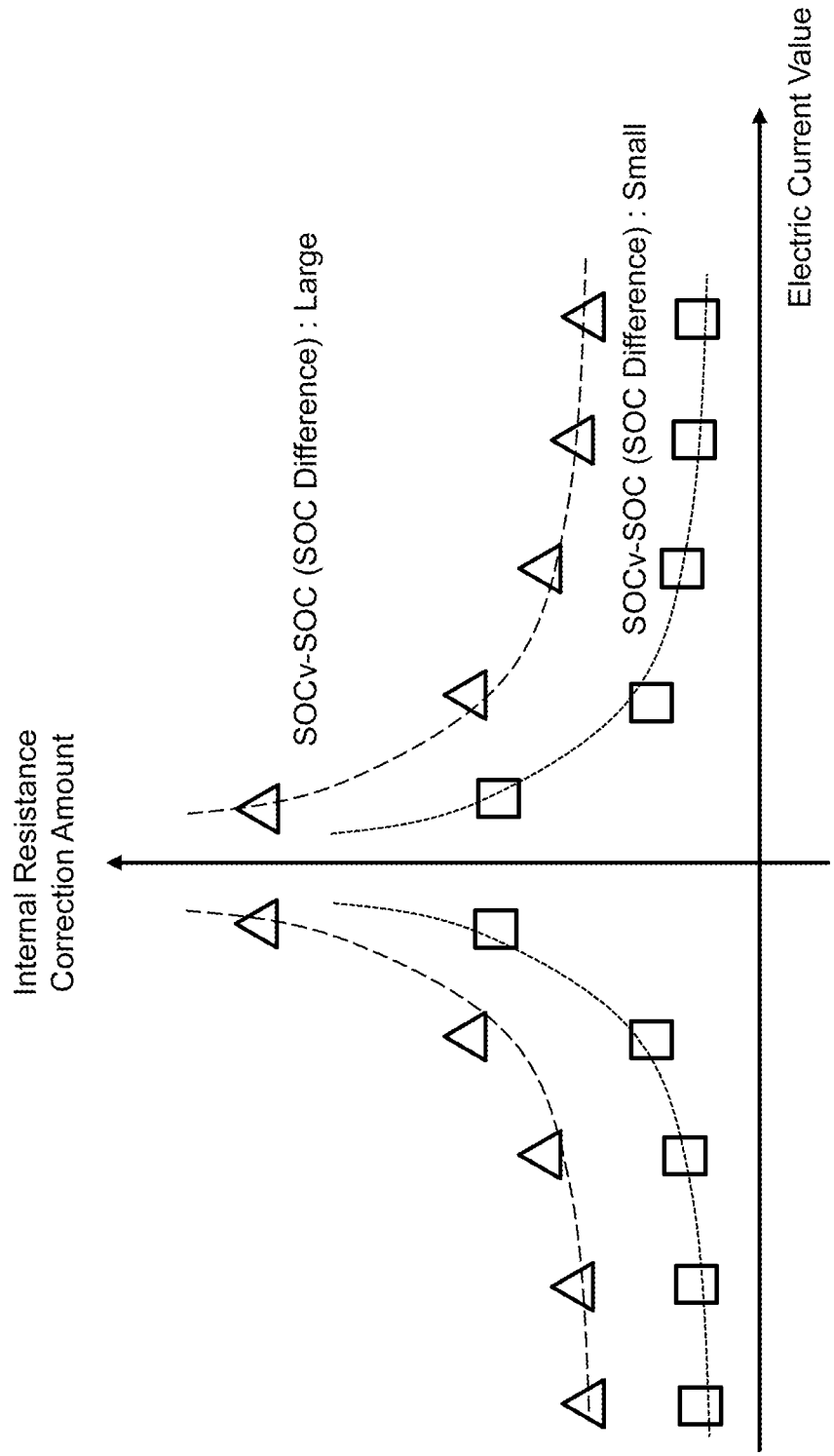
FIG. 11 is a diagram illustrating an internal resistance correction amount map according to Embodiment 1.

The internal resistance correction amount operation unit 153-1 computes the internal resistance correction amount on the basis of a resistance correction amount map illustrated in FIG. 11 by receiving inputs of the SOC, the SOCv, and the electric current, and outputs the computed internal resistance correction amount to the internal resistance correction unit 153-2. When the internal resistance correction unit 153-2 receives inputs of the judgment result of the internal resistance operation execution judgment unit 152, the SOC, and the temperature and if it is judged that it is possible to execute the operation of the internal resistance correction amount, the internal resistance correction unit 153-2 corrects the initial resistance value RoInit of the internal resistance Ro corresponding to the SOC and the temperature in the internal resistance table 182 stored in the storage unit 180 and outputs the corrected internal resistance value Ro to the SOH calculation unit 153-3.

The SOH calculation unit 153-3 calculates the SOH by using Expression (6) indicated below on the basis of the corrected internal resistance value Ro and the initial resistance value RoInit corresponding to the SOC and the temperature. The corrected internal resistance value Ro may be also used for various kinds of control of the battery other than the SOH calculation based on Expression (6) indicated below. Incidentally, in an example indicated in Expression (6) below, the SOH is indicated as a ratio of Ro to RoInit, but it may be a ratio of the corrected Rp to RpInit in the same manner as Ro.

[Math. 6]

$$SOH = 100 \times \frac{R_o}{R_{oInit}} \quad (6)$$

If it is judged that it is impossible to execute the internal resistance operation on the basis of the judgment result of either the internal resistance error detection unit 152-1 or the operation execution judgment unit 152-2, the internal resistance correction unit 153-2 does not correct the internal resistance value. Specifically speaking, the internal resistance value, which was computed in an operation cycle when it was most recently judged possible to execute the internal resistance operation, is output. For example, when the operation processing is executed in a specified operation cycle, if it was judged possible to execute the internal resistance operation in one cycle before the operation cycle where it is judged impossible to execute the internal resistance operation, the internal resistance value computed in this operation cycle which is one cycle before the latest cycle is output.

Next, the processing content of the internal resistance correction amount operation unit 153-1 will be explained with reference to FIG. 11. FIG. 11 illustrates an example of a map of the resistance correction amount according to the electric current value and the SOC difference (SOCv-SOC). In this embodiment, the SOC difference is detected as an error caused by a deviation of the internal resistance and the control to correct the internal resistance is assumed. Accordingly, as the SOC difference is larger, the deviation of the internal resistance becomes larger. Specifically speaking, as the SOC difference is larger, the value of the internal resistance to be corrected is made larger, that is, a large resistance correction amount is set.

Then, electric current dependency of the correction amount will be examined. If the SOC difference is the same, that is, if an SOCv error is the same, Vo and Vp errors attributable to the deviation of the internal resistance become also similar according to the aforementioned Expression (2). The Vo and Vp errors are determined by a product of the electric current and the internal resistance, so that if the Vo and Vp errors are constant, the deviation of the internal resistance becomes large when the electric current is small; and the deviation of the internal resistance becomes small when the electric current is large. When the correction amount of the internal resistance is defined in order to reflect this, and if an absolute value of the electric current value is as small as possible, the resistance correction amount is made larger; and if the absolute value of the electric current value is as large as possible, the resistance correction amount is made smaller.

To summarize the above, the resistance correction amount map may be constructed so that the internal resistance correction amount is set to be a larger value if the difference between the SOC operation value using the internal resistance (SOCv) and the SOC computed by the method different from the SOCv is larger and the absolute value of the electric current value is smaller.

Incidentally, regarding the internal resistance correction amount according to the SOC difference and the electric current illustrated in FIG. 11, a correction value may be decided in advance as a map or a table and may be stored in the storage unit 180 or the relationship may be described by a mathematical expression and implemented as the mathematical expression.

Figure 12:
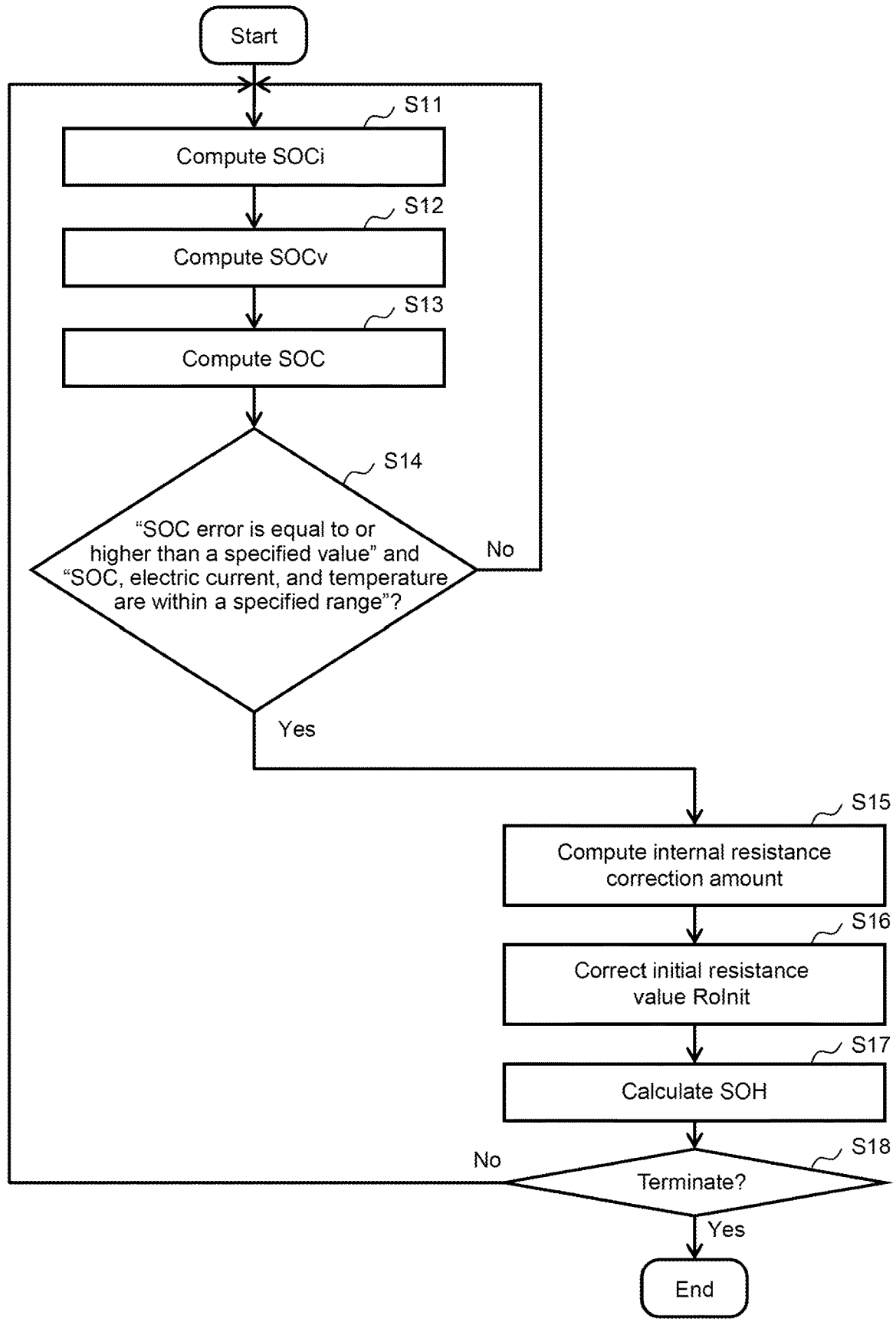
FIG. 12 is a flowchart illustrating SOH calculation processing according to Embodiment 1.

Next, the SOH calculation processing according to Embodiment 1 will be explained with reference to a flowchart in FIG. 12. FIG. 12 is a flowchart illustrating the SOH calculation processing according to Embodiment 1. The SOH calculation processing is executed repeatedly by the assembled battery control unit 150 until the electrically-powered system S including the battery system 100 is activated and shut down.

Firstly, in step S11, the assembled battery control unit 150 causes the SOCi operation unit 151-1 for the SOC operation unit 151 to compute the SOCi according to the aforementioned Expression (1). Next, in step S12, the assembled battery control unit 150 causes the SOCv operation unit 151-2 for the SOC operation unit 151 to compute the SOCi according to the aforementioned Expression (2) and Expression (3). Then, in step S13, the assembled battery control unit 150 causes the combined operation unit 151-3 for the SOC operation unit 151 to compute the SOC according to the aforementioned Expression (4) and Expression (5). The assembled battery control unit 150 stores the SOC, which was calculated in step S13, in a variable SOC_old.

Subsequently, in step S14, the assembled battery control unit 150: causes the internal resistance error detection unit 152-1 for the internal resistance operation execution judgment unit 152 to judge whether or not the SOCv error (the absolute value of the difference between the SOC and the SOCv) is equal to or more than the specified value; and causes the operation execution judgment unit 152-2 to judge whether or not all the SOC, the electric current, and the temperature which have been input are within the specified range. The assembled battery control unit 150 causes the correction possibility judgment unit 152-3 for the internal resistance operation execution judgment unit 152 to: judge that the internal resistance correction operation should be executed if the judgment result of step S14 is Yes, and then proceed to processing in step S15; and judge that the internal resistance correction operation should not be executed if the judgment result of step S14 is NO, and then return to the processing in step S11.

In step S15, the assembled battery control unit 150 causes the internal resistance correction amount operation unit 153-1 for the SOH operation unit 153 to compute the internal resistance correction amount from the internal resistance correction amount map illustrated in FIG. 11 by receiving inputs of the SOC, the SOCv, and the electric current. Next, in step S16, the assembled battery control unit 150 causes the internal resistance correction unit 153-2 for the SOH operation unit 153 to output the corrected internal resistance value Ro, which is obtained by correcting the initial resistance value RoInit corresponding to the SOC and the temperature in the internal resistance table 182 according to the first expression of the aforementioned Expression (3) by receiving inputs of the judgment result of the internal resistance operation execution judgment unit 152, the SOC, and the temperature, to the SOFT calculation unit 153-3.

Next, in step S17, the assembled battery control unit 150 causes the SOH calculation unit 153-3 to calculate the SOH according to the aforementioned Expression (6) on the basis of the corrected internal resistance value Ro and the initial resistance value RoInit corresponding to the SOC and the temperature. The assembled battery control unit 150 stores the SOH, which is calculated in step S18, in the variable SOH_old.

Then, in step S18, the assembled battery control unit 150 judges whether the electrically-powered system S including the battery system 100 is to be shut down or not; and if the electrically-powered system S is to be shut down (step S18: Yes), the assembled battery control unit 150 terminates this SOH calculation processing; and if the electrically-powered system S is not to be shut down (step S18: No), the assembled battery control unit 150 returns to the processing in step S11.

Figure 13:
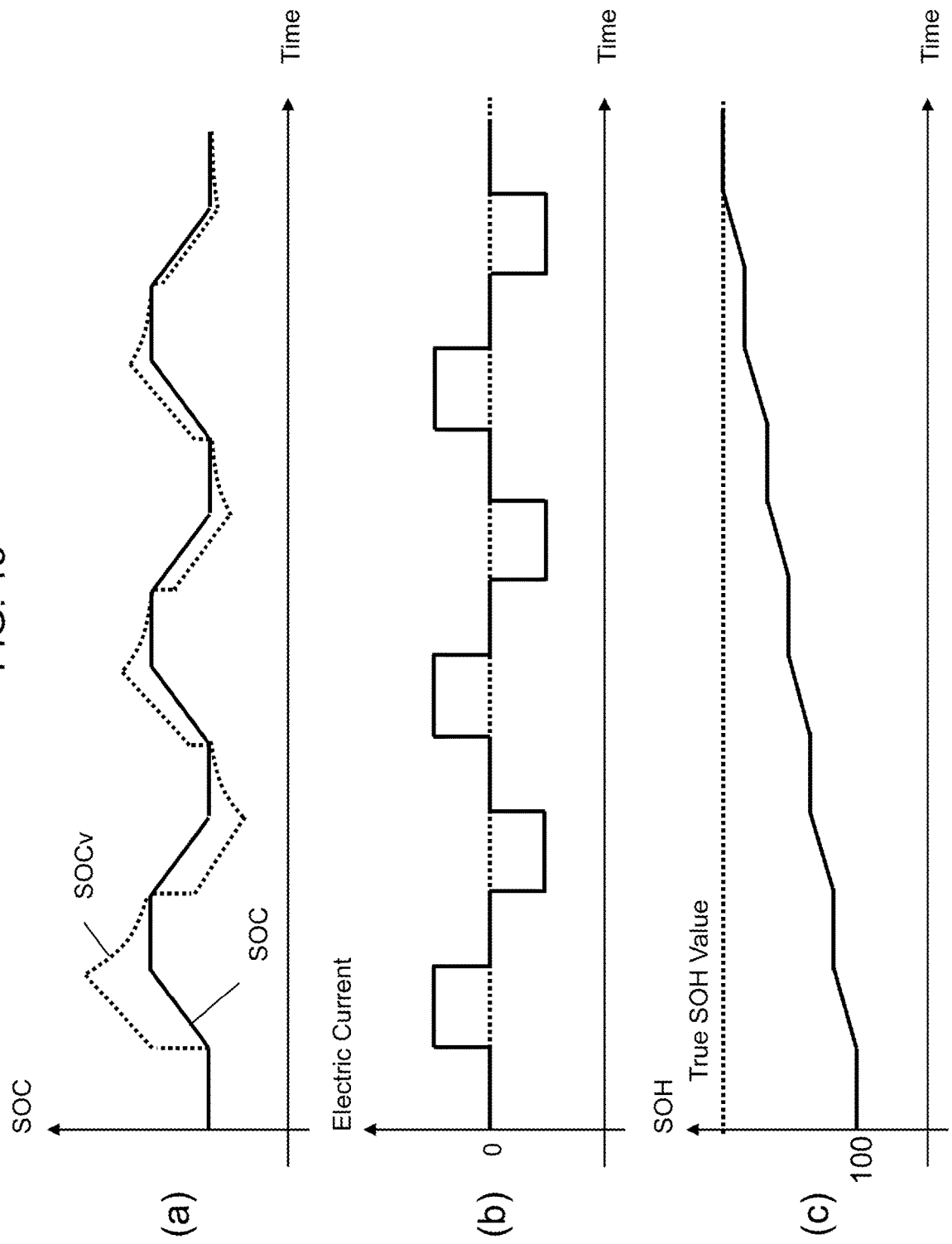
FIG. 13 is a diagram illustrating profiles of an SOH operation when inputting electric charge/discharge pulses according to a conventional technique.
Figure 14:
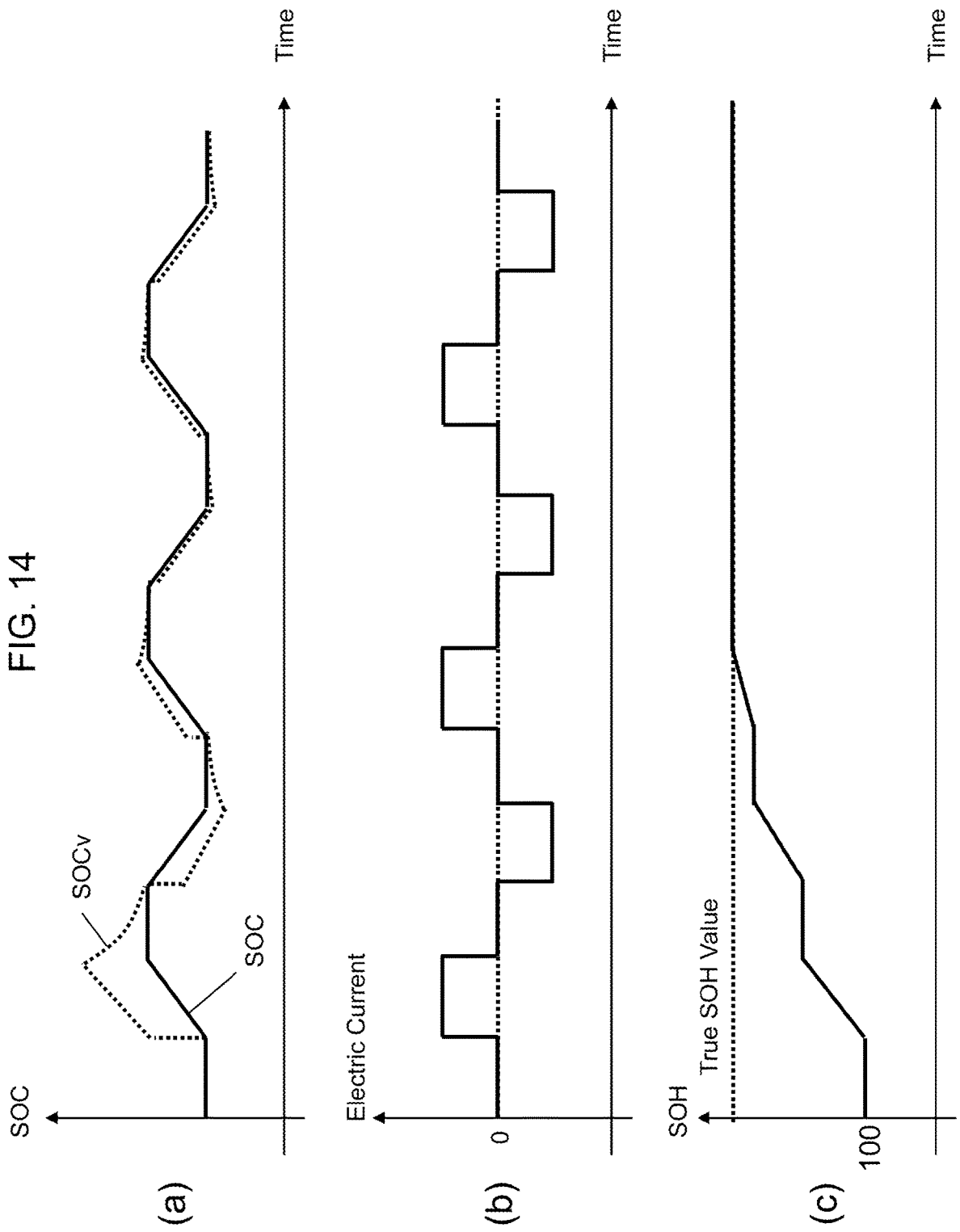
FIG. 14 is a diagram illustrating profiles of the SOH operation when inputting the electric charge/discharge pulses according to Embodiment 1.

Subsequently, the advantageous effects of Embodiment 1 will be explained with reference to FIG. 13 and FIG. 14. FIG. 13 is a diagram illustrating profiles of an SOH operation according to a conventional technology when inputting electric charge/discharge pulses. FIG. 14 is a diagram illustrating profiles of an SOH operation according to Embodiment 1 when inputting the electric charge/discharge pulses.

Each of FIG. 13 and FIG. 14 shows waveforms of (a) an SOC operation value, (b) the electric current, (c) an operation value of the SOH (an increase rate of the internal resistance) when inputting a charging/discharging electric current of rectangular waves which repeat electric charging or discharging. FIG. 13 shows the result of a conventional method before applying the present invention (a fixed value of the resistance correction amount) and FIG. 14 shows the result of the case where the present invention is applied. In FIG. 13 and FIG. 14, an initial SOH value is set as 100% and a state where there is a large divergence from a true value is assumed.

Referring to the waveform of the SOC indicated in FIG. 13(a), the waveform of the SOC (SOCv) based on the internal resistance in a region immediately after starting the electric charging/discharging has a large divergence from the SOC operation value due to the influence of the SOH operation error (the error of the internal resistance). Under this circumstance, the difference between the SOCv and the SOC is extracted, the internal resistance is corrected with the fixed value and the SOH operation value is gradually updated (FIG. 13(c)). When the internal resistance is corrected with the fixed value, the SOCv accordingly becomes closer to the SOC operation value, that is, the SOC difference becomes smaller; and at the end of the electric charging/discharging, the SOH operation value converges to the true SOH value and the SOC difference also becomes small.

Next, FIG. 14 shows waveforms of the SOC, the electric current, and the SOH when the present invention is applied. Referring to the waveform of the SOC indicated in FIG. 14(a), you can see that the waveform of the SOCv in the region immediately after starting the electric charging/discharging has a large divergence from the SOC due to the influence of the SOH error in the same manner as with the conventional technology as illustrated in FIG. 13. Under this circumstance, the difference between the SOCv and the SOC is extracted and the internal resistance is corrected; however, you can see that by using the resistance correction amount map as illustrated in FIG. 11, when the SOC difference is larger, the internal resistance correction amount becomes larger and, therefore, an update speed for the SOH to become closer to the true value is faster than the conventional method. As the SOC difference decreases, the resistance correction amount becomes smaller, so that the update speed for the SOH to become closer to the true value decreases; however, you can see that at the end, the operation value converges to the true value at a faster speed which is about a half of the speed of the conventional method.

According to this embodiment, by correcting the internal resistance and computing the SOH by using the internal resistance correction amount which is decided on the basis of the difference between the SOC (SOCv) based on the internal resistance and the SOC computed by the method different from that of the SOCv, and the electric current value, the convergence property of the SOH operation enhances significantly as compared to the case where the internal resistance correction amount is the fixed value as in the conventional case; and it becomes possible to maintain the SOH operational precision (the difference between a final convergence value and the true value) equivalent to the conventional precision.

Specifically speaking, as the internal resistance value which is corrected according to the SOC difference and the electric current value is made variable, the resistance correction amount can be set to be large in a state where the difference between the SOH recognized by the battery control apparatus and the true SOH value of the control target battery is large; and, therefore, the convergence property of the SOH operation value enhances. Furthermore, as the SOH operation value is updated and becomes closer to the true value, the correction amount of the internal resistance value becomes small; and, therefore, the SOH can be computed with good precision without impairing stability. As a result, both the operational precision and the convergence property can be achieved, so that it becomes possible to precisely recognize the electric power which can be input/output by the battery and also precisely compute the index for changing the battery.

Embodiment 2

Figure 15:
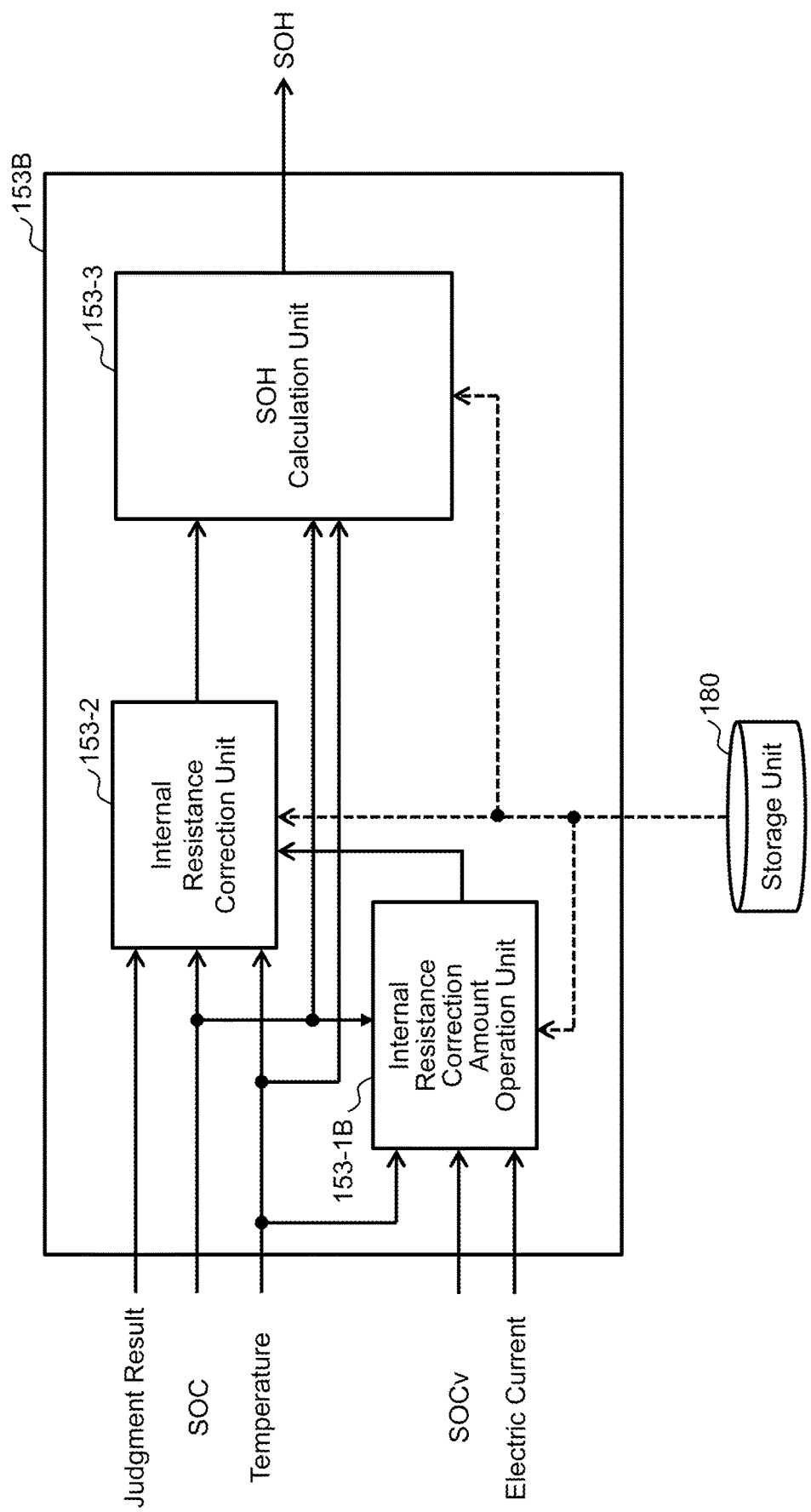
FIG. 15 is a block diagram illustrating the configuration of an SOH operation unit according to Embodiment 2.

Embodiment 2 of the present invention will be explained with reference to FIG. 15 and FIG. 16.

Embodiment 1 has described the method for controlling the correction amount of the internal resistance value on the basis of the difference between the SOC (SOCv) computed based on the resistance, the SOC (SOCi) based on the electric current, and the SOC calculated by a combination with SOCv, and the electric current value.

In this embodiment, an explanation will be provided about an example where the temperature of the battery is further added to the control of the internal resistance correction amount. In the description of this embodiment, the difference from Embodiment 1 will be mainly explained and an explanation of parts of the configuration similar to those of Embodiment 1 is omitted. The difference between this embodiment and Embodiment 1 is that in this embodiment the assembled battery control unit 150 has an SOH operation unit 153B instead of the SOH operation unit 153. The SOH operation unit 153B will be explained below.

The SOH operation unit 153B according to this embodiment will be explained with reference to FIG. 15. FIG. 15 is a block diagram illustrating the configuration of the SOH operation unit 153B according to Embodiment 2. As compared to the SOH operation unit 153 according to Embodiment 1, the SOH operation unit 153B includes an internal resistance correction amount operation unit 153-1B instead of the internal resistance correction amount operation unit 153-1 and the temperature of the battery is added as an input. The internal resistance correction amount operation unit 153-1B computes the internal resistance correction amount by receiving inputs of the SOC difference, the electric current, and the temperature, and outputs the computed internal resistance correction amount to the internal resistance correction unit 153-2.

A method for computing the internal resistance correction amount by the internal resistance correction amount operation unit 153-1B will be explained with reference to FIG. 16. FIG. 16 is a diagram illustrating an internal resistance correction amount map according to Embodiment 2 and shows the internal resistance correction amount according to the SOC difference at each temperature T.

Generally, the internal resistance of the battery has a tendency to decrease along with a rise in the temperature. Accordingly, if the internal resistance correction amount is set to be a uniform amount according to the temperature T, the internal resistance correction amount may sometimes become too large for the internal resistance value itself. If the internal resistance correction amount is too large for the internal resistance value when computing the SOH as a ratio of a current internal resistance value to the internal resistance value as a new product, there is a possibility that the SOH value may fluctuate significantly and vibrate. Contrarily, if the internal resistance correction amount is too small for the internal resistance value, changes in the SOH value become subtle, so that there is a possibility that the convergence speed to the true value of the SOH operation value may decrease.

Figure 16:
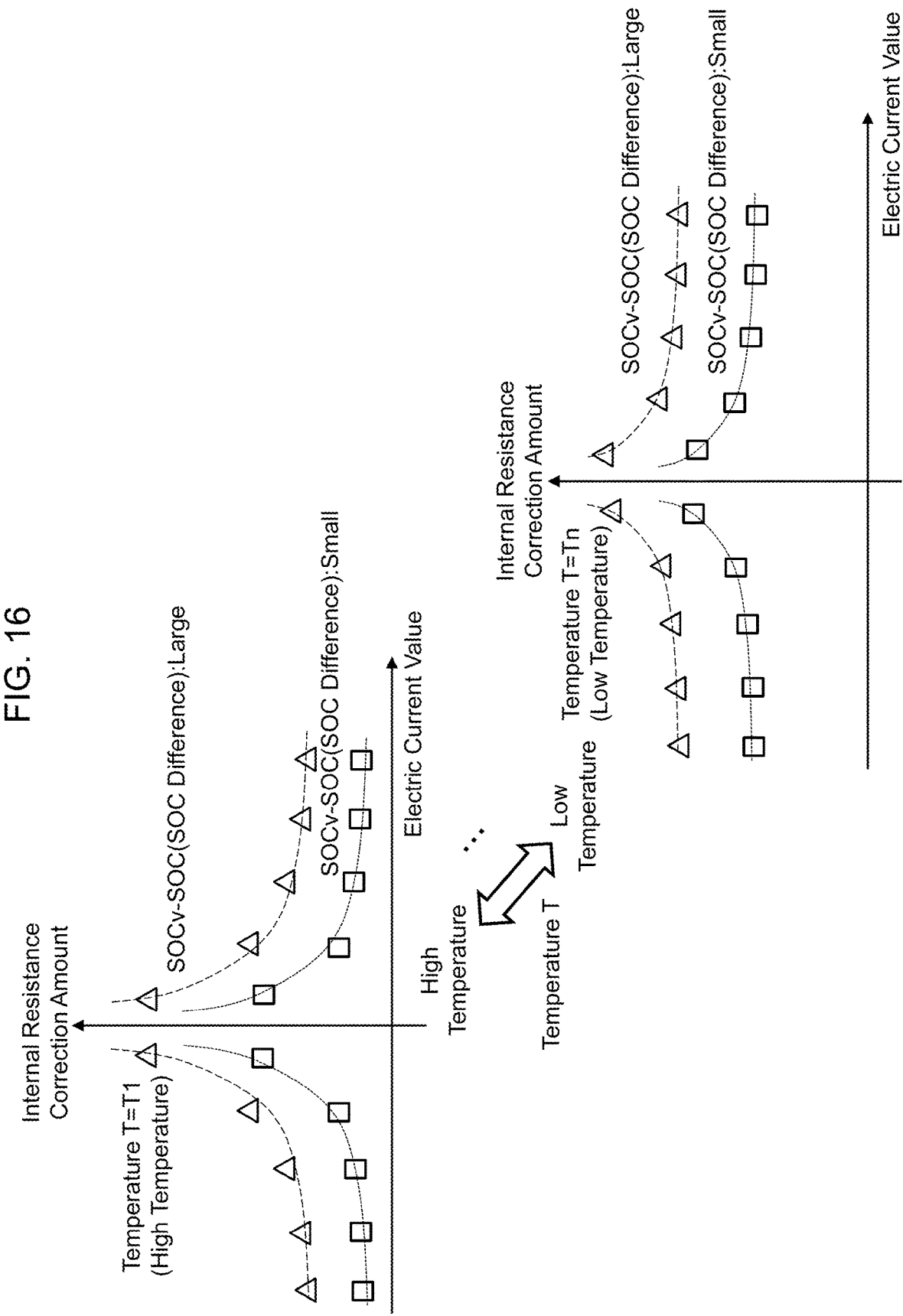
FIG. 16 is a diagram illustrating an internal resistance correction amount map according to Embodiment 2.

So, as indicated in the resistance correction amount map illustrated in FIG. 16 as compared to the resistance correction amount map illustrated in FIG. 10, the internal resistance correction amount is set as generally a small value in a high temperature range where the internal resistance value becomes small; and contrarily, the internal resistance correction amount is set as generally a large value in a low temperature region where the internal resistance value becomes large. Specifically speaking, in this embodiment, the resistance correction amount map is constructed so that the internal resistance correction amount is set to be a large value when the difference between the SOC operation value (SOCv) based on the internal resistance and the SOC computed by the method different from that of the SOCv is larger, the absolute value of the electric current value is smaller, and the temperature of the battery is higher.

By constructing the resistance correction amount map as described above, it becomes possible to execute the SOH operation for which the convergence property and the stability are secured for the internal resistance value which varies depending on the temperature.

Incidentally, regarding the internal resistance correction amount according to the SOC difference, the electric current, and the temperature as illustrated in FIG. 16, the correction value may be decided in advance as a map or a table and stored in the storage unit 180 or the relationship may be described as a mathematical expression and may be implemented as the mathematical expression.

Next, advantages effects of this embodiment will be explained with reference to FIG. 17 and FIG. 18.

Figure 17:
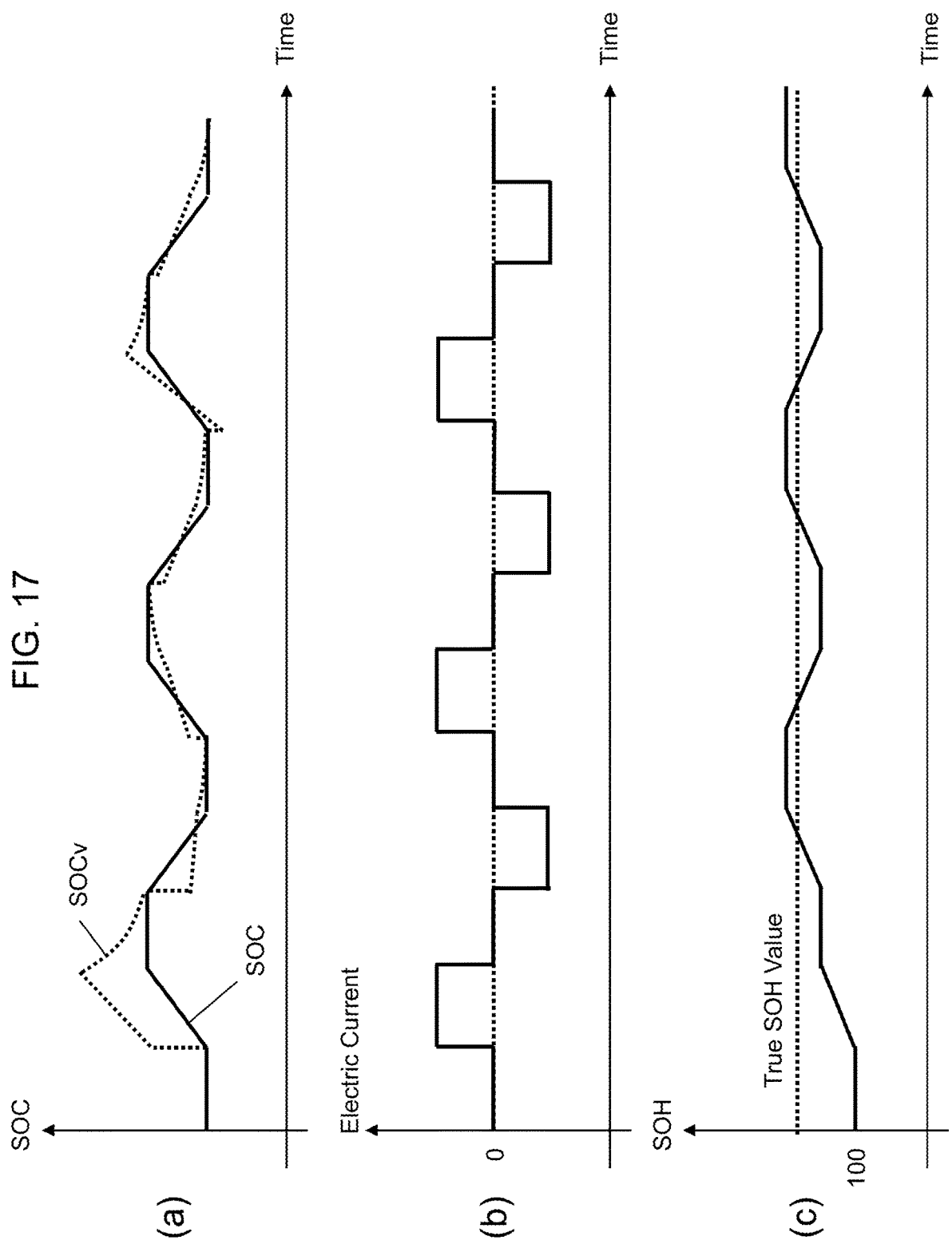
FIG. 17 is a diagram illustrating profiles of the SOH operation when inputting the electric charge/discharge pulses in a high temperature range according to Embodiment 1.
Figure 18:
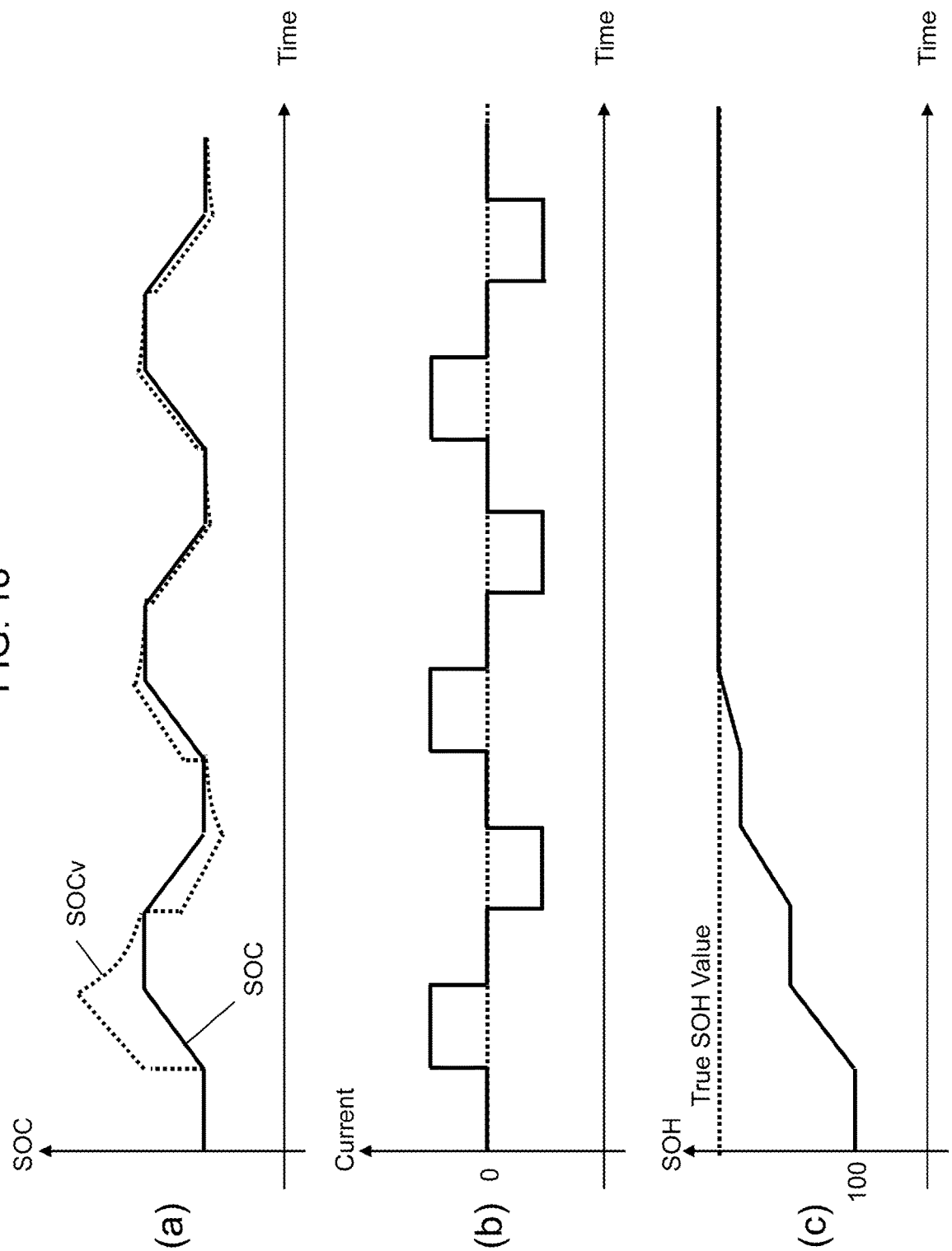
FIG. 18 is a diagram illustrating profiles of the SOH operation when inputting the electric charge/discharge pulses in the high temperature range according to Embodiment 2.

Each of FIG. 17 and FIG. 18 shows waveforms of (a) an SOC operation value, (b) the electric current, (c) an operation value of the SOH (an increase rate of the internal resistance) when inputting a charging/discharging electric current of rectangular waves which repeat electric charging or discharging. FIG. 17 illustrates an operation result example where the SOH operation is executed within the high temperature range (for example, 50° C.) by using, for example, the internal resistance correction amount which is set within a normal temperature range (for example, 25° C.).

When the SOH is computed within the high temperature range where the internal resistance value is small, although the initial resistance value RoInit which is a denominator is smaller than that at a normal temperature as in Expression (6), when calculating the internal resistance value Ro at the current time point of a numerator, there is a possibility that due to the influence of a large correction amount of the internal resistance, the SOH operation value may fluctuate intensely and, in some case, the operation value may not converge in the vicinity of the true SOH value, but vibrate as illustrated in FIG. 17(c).

On the other hand, if an appropriate internal resistance correction amount is set at each temperature, that is, if the operation is executed by setting the internal resistance correction amount as a smaller value in a case of the high temperature range, it can be confirmed as illustrated in FIG. 18(c) that the vibrations in the vicinity of the true SOH value can be suppressed and the operation capable of securing the convergence property can be implemented.

According to this embodiment, it becomes possible to compute the SOH for which the stability and the convergence property are secured even for various different internal resistance values according to the temperature by computing the SOH by correcting the internal resistance by using the internal resistance correction amount which is decided according to the difference between the SOC based on the internal resistance (SOCv) and the SOC computed by the method different from that of the SOCv, the electric current value, and the temperature.

Figure 19:
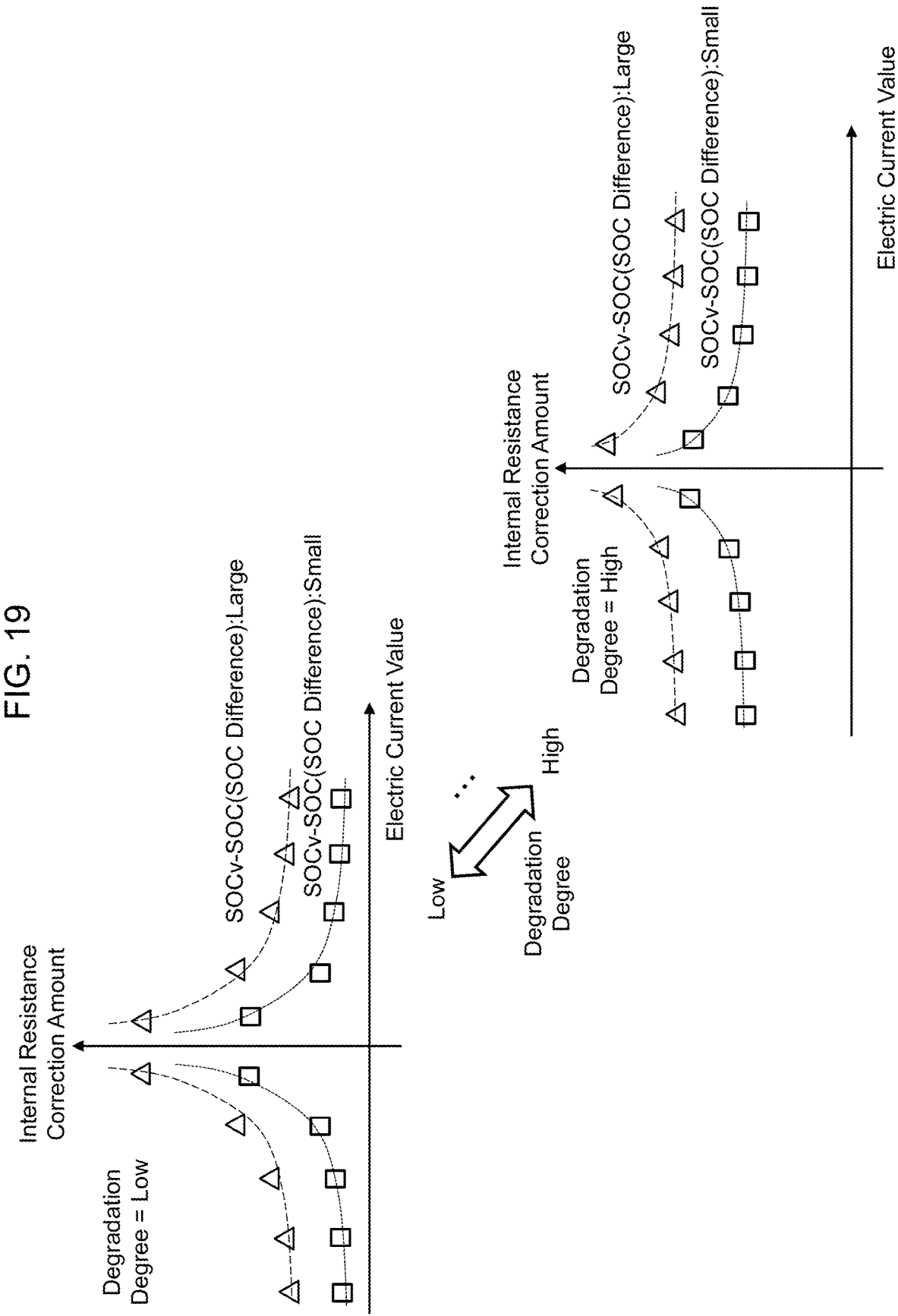
FIG. 19 is a diagram illustrating a resistance correction amount map according to a variation of Embodiment 2.

This embodiment has described the example where the correction amount is adjusted by focusing on the fact that the internal resistance value varies depending on the temperature; and also in a case other than the above, the internal resistance value varies depending on, for example, a degradation degree of the battery. Therefore, the internal resistance correction amount may be decided according to the degradation degree. Specifically speaking, as can be seen in a resistance correction amount map in a variation of Embodiment 2 illustrated in FIG. 19 as compared to the resistance correction amount map illustrated in FIG. 10, when the battery is a new product, the degradation degree SOH is small and the internal resistance is small and the internal resistance correction amount is thereby made generally small; and when the degradation degree SOH becomes large and the internal resistance becomes large along with the progress of the degradation, the internal resistance correction amount is made generally large. Incidentally regarding the internal resistance correction amount according to the SOC difference, the electric current, and the degradation degree as illustrated in FIG. 19, the correction value may be decided in advance as a map or a table and stored in the storage unit 180 or the relationship may be described as a mathematical expression and be implemented as the mathematical expression.

Specifically speaking, the resistance correction amount map is constructed so that the internal resistance correction amount is set to be a large value when the difference between the SOC operation value (SOCv) based on the internal resistance and the SOC computed by the method different from that of the SOCv is larger, the absolute value of the electric current value is smaller, and the degradation degree of the battery is larger. Consequently, it becomes possible to correct the internal resistance with the internal resistance correction amount which is appropriate to secure the stability and the convergence property according to the degradation degree of the battery and, as a result, it becomes possible to achieve both the stability and the convergence property of the SOH operation value.

The above explanation is merely an example and the present invention is not limited at all to the configurations of the above-described embodiments, but includes various variations. For example, the aforementioned embodiments have been described in detail in order to explain the present invention in an easily comprehensible manner and are not necessarily limited to those having all the configurations explained above. Furthermore, part of the configuration of a certain embodiment can be replaced with the configuration of another embodiment. Also, the configuration of another embodiment can be added to the configuration of a certain embodiment. Moreover, regarding part of the configuration of each embodiment, it is possible to add, delete, or replace the other configuration.

Furthermore, the respective steps in the processing in each embodiment may be executed by switching their sequential order as appropriate as long as the same result can be obtained.

REFERENCE SIGNS LIST

S: electrically-powered system
100: battery system
110: assembled battery
111: single battery
112: single battery group
120: single battery management unit
121: single battery control unit
122: voltage detection circuit
123: control circuit
124: signal input/output circuit
125: temperature detection unit
130: electric current detection unit
140: voltage detection unit
150: assembled battery control unit
151: SOC operation unit
151-1: SOCi operation unit
151-2: SOCv operation unit
151-3: combined operation unit
152: internal resistance operation execution judgment unit
152-1: internal resistance error detection unit
152-2: operation execution judgment unit
152-3: correction possibility judgment unit
152-4: electric conduction time measurement unit
153: SOH operation unit
153-1: internal resistance correction amount operation unit
153-2: internal resistance correction unit
153-3: SOH calculation unit
160: signal communication unit
170: insulation element
180: storage unit
200: vehicle control unit
300, 310: relays
400: inverter
410: motor
420: motor/inverter control unit

The invention claimed is:

1. A battery control apparatus comprising:
a first operation unit that computes a first state of charge of a battery according to a first technique on a basis of an electric current value, a voltage value, and an internal resistance value of the battery;
a second operation unit that computes a second state of charge of the battery according to a second technique different from the first technique;
an internal resistance operation execution judgment unit that judges that an internal resistance correction operation can be executed if a difference between the first state of charge and the second state of charge is equal to or more than a specified value;
an internal resistance correction amount operation unit that computes a resistance correction amount according to an absolute value of the difference between the first state of charge and the second state of charge and an absolute value of the electric current value; and
an internal resistance correction unit that corrects the internal resistance value with the computed resistance correction amount if it is judged that the internal resistance correction operation can be executed,
wherein the resistance correction amount becomes a larger value when the difference is larger and an absolute value of the electric current value is smaller.

2. The battery control apparatus according to claim 1, further comprising a degradation degree operation unit that computes a degradation degree of the battery on the basis of the internal resistance value corrected by the internal resistance correction unit.

3. The battery control apparatus according to claim 1, wherein if the second state of charge, the electric current value, and a temperature of the battery satisfy a specified condition, the internal resistance correction unit further corrects the internal resistance value with the computed resistance correction amount.

4. The battery control apparatus according to claim 3, wherein if the difference is not detected or the second state of charge does not satisfy the specified condition, the internal resistance correction unit does not correct the internal resistance value, but outputs the internal resistance value which was corrected in an immediately preceding operation cycle during which the difference was detected and it was judged that the second state of charge, the electric current value, and the temperature of the battery satisfied the specified condition.

5. The battery control apparatus according to claim 1, wherein the resistance correction amount is further a value according to a temperature of the battery.

6. The battery control apparatus according to claim 5, wherein the resistance correction amount is a smaller value when the temperature of the battery is higher.

7. The battery control apparatus according to claim 1, wherein the resistance correction amount is further a value according to a degradation degree of the battery.

8. The battery control apparatus according to claim 7, wherein the resistance correction amount is a larger value when the degradation degree of the battery is higher.

9. The battery control apparatus according to claim 1, wherein the first technique computes the first state of charge based on an open circuit voltage of the battery calculated using the electric current value, voltage value, and internal resistance value.

10. The battery control apparatus according to claim 1, wherein the second technique computes the second state of charge by adding a change amount of state of charge caused by current flow to a previous state of charge value.

11. The battery control apparatus according to claim 1, wherein the first state of charge and the second state of charge are combined using a weighted average, and
   wherein a weight coefficient becomes smaller when the electric current value is larger and becomes larger when the electric current value is smaller.

12. A battery system comprising:
   the battery control apparatus stated in claim 1; and
   an assembled battery in which a plurality of batteries are connected and controlled by the battery control apparatus.

* * * * *